(12) United States Patent
Shirini et al.

(10) Patent No.: US 10,477,133 B2
(45) Date of Patent: Nov. 12, 2019

(54) SOLID-STATE IMAGING SENSOR AND SOLID-STATE IMAGING DEVICE

(71) Applicant: Sony Semiconductor Solutions Corporation, Kanagawa (JP)

(72) Inventors: Soraya Shirini, Kanagawa (JP); Takahisa Ueno, Kanagawa (JP); Katsuhiko Hanzawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 17 days.

(21) Appl. No.: 15/722,484

(22) Filed: Oct. 2, 2017

(65) Prior Publication Data

US 2019/0104268 A1   Apr. 4, 2019

(51) Int. Cl.
| | |
|---|---|
| *H04N 5/378* | (2011.01) |
| *H04N 5/343* | (2011.01) |
| *H04N 5/376* | (2011.01) |
| *H04N 5/3745* | (2011.01) |
| *H04N 5/369* | (2011.01) |
| *H04N 5/361* | (2011.01) |
| *H04N 5/355* | (2011.01) |
| *H01L 27/146* | (2006.01) |

(Continued)

(52) U.S. Cl.
CPC ......... *H04N 5/378* (2013.01); *H01L 27/1463* (2013.01); *H01L 27/14603* (2013.01); *H01L 27/14612* (2013.01); *H01L 27/14623* (2013.01); *H04N 5/2353* (2013.01); *H04N 5/343* (2013.01); *H04N 5/35554* (2013.01); *H04N 5/361* (2013.01); *H04N 5/363* (2013.01); *H04N 5/3698* (2013.01); *H04N 5/374* (2013.01); *H04N 5/376* (2013.01); *H04N 5/3745* (2013.01); *H01L 27/1464* (2013.01); *H01L 27/14634* (2013.01); *H01L 27/14641* (2013.01); *H01L 27/14643* (2013.01)

(58) Field of Classification Search
CPC ...... H04N 5/378; H04N 5/374; H04N 5/2353; H04N 5/363; H04N 5/3741; H04N 5/343; H04N 5/376; H04N 5/3745; H04N 5/3698; H04N 5/361; H04N 5/35554; H01L 27/14634; H01L 27/14612; H01L 27/14643; H01L 27/1463; H01L 27/14623; H01L 27/14603; H01L 27/14641; H01L 27/1464
USPC ......................................... 348/302–308, 363
See application file for complete search history.

(56) References Cited

U.S. PATENT DOCUMENTS

| | | | |
|---|---|---|---|
| 8,441,535 B2 * | 5/2013 | Morin | H04N 5/345 348/148 |
| 9,332,200 B1 * | 5/2016 | Hseih | H04N 5/363 |

(Continued)

FOREIGN PATENT DOCUMENTS

WO   WO2016158483   * 10/2016

*Primary Examiner* — Albert H Cutler
(74) *Attorney, Agent, or Firm* — Wolf, Greenfield & Sacks, P.C.

(57) ABSTRACT

There is provided a solid-state image sensor including: a selection signal terminal configured to receive a selection signal designated by a pixel address in a two-dimensionally arranged pixel array; a photoelectric conversion section configured to generate a charge in accordance with incident light and store the charge in accordance with the selection signal; and a charge retention section configured to retain the charge stored in the photoelectric conversion section at a prescribed timing.

9 Claims, 26 Drawing Sheets

(51) Int. Cl.
    *H04N 5/374*     (2011.01)
    *H04N 5/363*     (2011.01)
    *H04N 5/235*     (2006.01)

(56) References Cited

U.S. PATENT DOCUMENTS

| | | | |
|---|---|---|---|
| 2001/0005226 A1* | 6/2001 | Muramatsu | H04N 5/361 348/304 |
| 2009/0086071 A1* | 4/2009 | Kagawa | G01J 1/46 348/300 |
| 2010/0188543 A1* | 7/2010 | Oike | H01L 27/14609 348/308 |
| 2013/0215306 A1* | 8/2013 | Yamashita | H04N 5/378 348/302 |
| 2014/0049675 A1* | 2/2014 | Takatsuka | H04N 5/3698 348/303 |
| 2016/0056199 A1* | 2/2016 | Kim | H01L 27/14643 250/208.1 |
| 2016/0148968 A1* | 5/2016 | Nakamura | H01L 27/14643 257/446 |
| 2016/0155768 A1* | 6/2016 | Yi | H01L 27/14643 250/208.1 |
| 2017/0033145 A1* | 2/2017 | Miki | H01L 27/14641 |
| 2017/0244921 A1* | 8/2017 | Velichko | H01L 27/14627 |
| 2017/0366764 A1* | 12/2017 | Innocent | H04N 5/353 |
| 2019/0013799 A1* | 1/2019 | Sakakibara | H03K 5/08 |

\* cited by examiner

FIG. 7
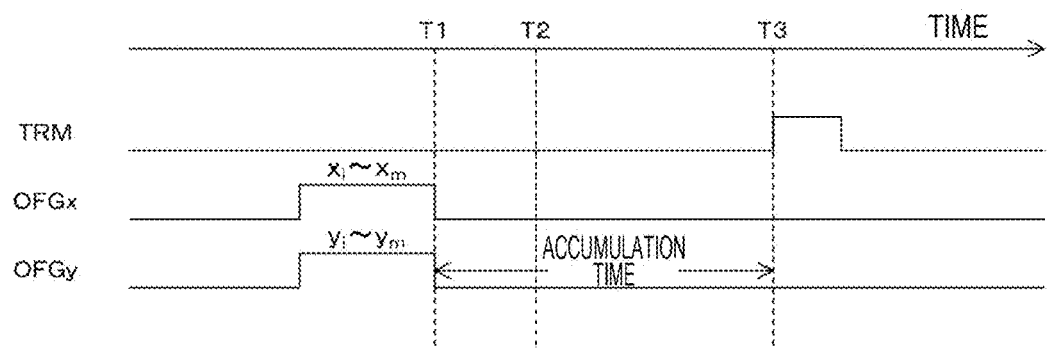
a
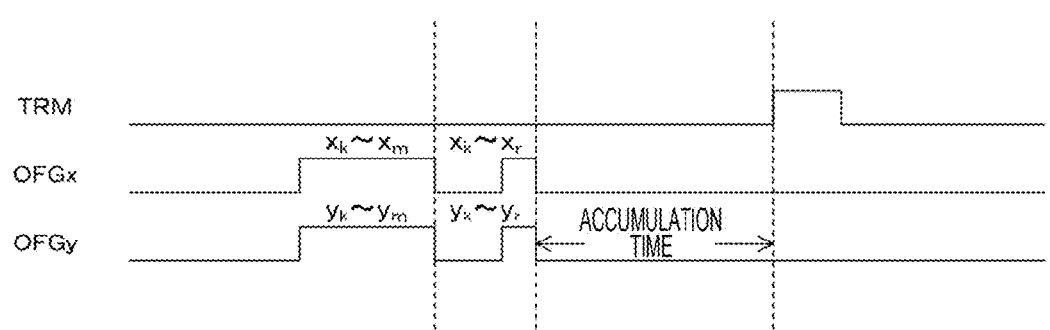
b
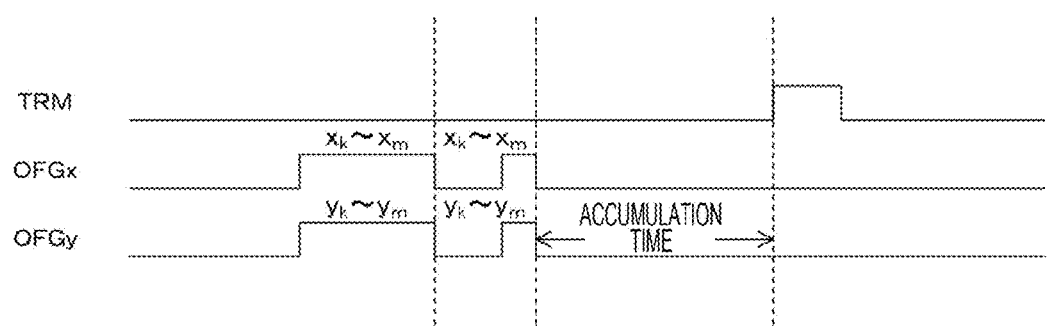
c

SOLID-STATE IMAGING SENSOR AND SOLID-STATE IMAGING DEVICE

BACKGROUND

The present technology relates to a solid-state image sensor. Specifically, the present technology relates to a solid-state image sensor and a solid-state imaging device including a photoelectric conversion section that generates and stores a charge in accordance with incident light.

When performing image processing or the like, there is a case where processing is performed with a focus on a specific region in an image. The region in this case is called a region of interest (ROI). There is a case where a plurality of regions of interest are set in an image, and further there is a case where they overlap with each other. In this event, those regions of interest are separately handled, and therefore it is desirable to control the amount of exposure and the resolution independently. In general, in a rolling shutter system, shutter operation is performed in units of one row; and in a global shutter system, shutter operation is performed collectively on all the pixels. In contrast, a technology in which only a region necessary for a selected area that is cropped by a driving mode called window reading is imaged is proposed (for example, see JP 2011-101159A).

SUMMARY

In the existing technology described above, the resolution is changed by changing the thinning-out rate in the event of reading pixel data, in accordance with the size of a display frame. However, in this existing technology, thinning-out is performed in units of rows, and therefore it is difficult to control exposure for an arbitrary region.

Thus, it is desirable to perform exposure control for an arbitrary region in an image to be captured.

The present technology has been achieved to solve the above-mentioned issue, and according to a first aspect, there is provided a solid-state image sensor including: a selection signal terminal configured to receive a selection signal designated by a pixel address in a two-dimensionally arranged pixel array; a photoelectric conversion section configured to generate a charge in accordance with incident light and store the charge in accordance with the selection signal; and a charge retention section configured to retain the charge stored in the photoelectric conversion section at a prescribed timing. This provides an action in which the charge to be stored in the photoelectric conversion section is controlled on a pixel basis in accordance with the selection signal.

Further, according to the first aspect, a charge release section may be configured to release the charge stored in the photoelectric conversion section in accordance with the selection signal. This provides an action in which the release of the charge stored in the photoelectric conversion section is controlled on a pixel basis in accordance with the selection signal.

Further, according to the first aspect, the selection signal may include a first decoded signal that shows a decoding result of a horizontal address in the pixel array and a second decoded signal that shows a decoding result of a vertical address in the pixel array, and the charge release section may release the charge stored in the photoelectric conversion section in a case where both of the first decoded signal and the second decoded signal are effective. This provides an action in which the release of the charge stored in the photoelectric conversion section is controlled on a pixel basis in accordance with the first and second decoded signals.

Further, according to the first aspect, the charge release section may include a first transistor in which a power source is connected to one end and that comes into conduction in a case where the first decoded signal is effective and a second transistor that is connected in series between the first transistor and the photoelectric conversion section and that comes into conduction in a case where the second decoded signal is effective. This provides an action in which the charge stored in the photoelectric conversion section is released in a case where the first and second decoded signals are effective.

Further, according to the first aspect, the charge release section may include a first transistor in which one of the first decoded signal and the second decoded signal is connected to a gate and another of the first decoded signal and the second decoded signal is connected to a drain, the first transistor supplying an effective signal from a source in a case where both of the first decoded signal and the second decoded signal are effective, and a second transistor that is connected in series between a power source and the photoelectric conversion section and that comes into conduction in a case where an effective signal is supplied from the source of the first transistor. This provides an action in which, while charge leakage from a diffusion layer is avoided, the charge stored in the photoelectric conversion section is released in a case where the first and second decoded signals are effective.

Further, according to the first aspect, the charge release section may include a transistor that is connected in series between a power source and the photoelectric conversion section, in which one of the first decoded signal and the second decoded signal is connected to a first gate and another of the first decoded signal and the second decoded signal is connected to a second gate, and that comes into conduction in a case where both of the first decoded signal and the second decoded signal are effective. This provides an action in which, using double gates, the charge stored in the photoelectric conversion section is released in a case where the first and second decoded signals are effective.

Further, according to the first aspect, the solid-state image sensor may include a first chip including the selection signal terminal, the photoelectric conversion section, and the charge retention section; and a second chip including the charge release section and being stacked on the first chip. This provides an action in which the charge retention section and the charge release section are formed on different chips.

Further, according to the first aspect, the solid-state image sensor may further include: a charge/voltage conversion section configured to store the charge retained in the charge retention section in order to convert the charge to a voltage; and a first transfer transistor and a second transfer transistor connected in series to each other and configured to transfer the charge retained in the charge retention section to the charge/voltage conversion section, in which the charge retention section may be formed integrally with a diffusion layer of the first transfer transistor. This provides an action in which dark current is suppressed.

Further, according to the first aspect, the solid-state image sensor may include a plurality of pixels each including the selection signal terminal, the photoelectric conversion section, and the charge retention section, and the solid-state image sensor may further include a charge/voltage conversion section configured to store the charge retained in the charge retention section in each of the plurality of pixels in order to convert the charge to a voltage. This provides an action in which the charge/voltage conversion section is shared by a plurality of pixels.

Further, according to the first aspect, the solid-state image sensor may further include: a charge resetting section configured to reset the charge stored in the charge/voltage conversion section. Further, solid-state image sensor may further include: a signal amplifying section configured to amplify the charge stored in the charge/voltage conversion section and output a pixel signal at a level in accordance with the charge.

Further, according to a second aspect of the present technology, there is provided a solid-state imaging device including: a pixel array in which a plurality of pixels each configured to convert incident light to a pixel signal are two-dimensionally arranged; an exposure control circuit configured to supply a selection signal that designates one of the plurality of pixels and control exposure in the designated pixel; and a reading circuit configured to read the pixel signal from each of the plurality of pixels, in which each of the plurality of pixels includes a selection signal terminal configured to receive the selection signal, a photoelectric conversion section configured to generate and store a charge in accordance with the incident light, a charge release section configured to release the charge stored in the photoelectric conversion section in accordance with the selection signal, a charge retention section configured to retain the charge stored in the photoelectric conversion section at a prescribed timing, and a charge/voltage conversion section configured to store the charge retained in the charge retention section in order to convert the charge to the pixel signal that is a voltage signal. This provides an action in which the release of the charge stored in the photoelectric conversion section of the pixel in the pixel array is controlled on a pixel basis in accordance with the selection signal.

Further, according to the second aspect, the exposure control circuit may include decoders each configured to decode each of positions in a horizontal direction and a vertical direction of a pixel address in the pixel array, and may supply the selection signal on a basis of a result of the decoding. This provides an action in which the release of the charge stored in the photoelectric conversion section is controlled on a pixel basis in accordance with the result of decoding.

Further, according to the second aspect, the exposure control circuit may supply the selection signal for each of specific regions in the pixel array. This provides an action in which the release of the charge stored in the photoelectric conversion section is controlled on a region basis.

Further, according to the second aspect, in a part where the specific regions overlap, the exposure control circuit may perform control in agreement with a specific region in which a time of charge accumulation to the photoelectric conversion section is shorter. This provides an action in which, in a part where regions overlap, exposure control is performed in agreement with a region in which the time of charge accumulation to the photoelectric conversion section is shorter.

According to an embodiment of the present technology, there is provided an excellent effect in which exposure control can be performed for an arbitrary region in an image to be captured. Note that the effect described herein is not necessarily a limitative one, and there may be any of the effects described in the present disclosure.

BRIEF DESCRIPTION OF THE DRAWINGS

FIG. 7 is a diagram showing examples of a relationship between signals and an accumulation time of regions in an embodiment of the present technology;

DETAILED DESCRIPTION OF THE EMBODIMENT(S)

Hereinbelow, embodiments for implementing the present technology (hereinafter, referred to as embodiments) are described. The description is given in the following order.
1. First embodiment (example in which two transistors are brought into conduction by two-dimensional address)
2. Second embodiment (example in which one transistor is brought into conduction by logical product of two-dimensional address)
3. Third embodiment (example in which two-dimensional address is inputted to different gates of one transistor to bring transistor into conduction)
4. Fourth embodiment (example of being divided into stacked chips)

1. First Embodiment

[Solid-State Imaging Device]

Figure 1:
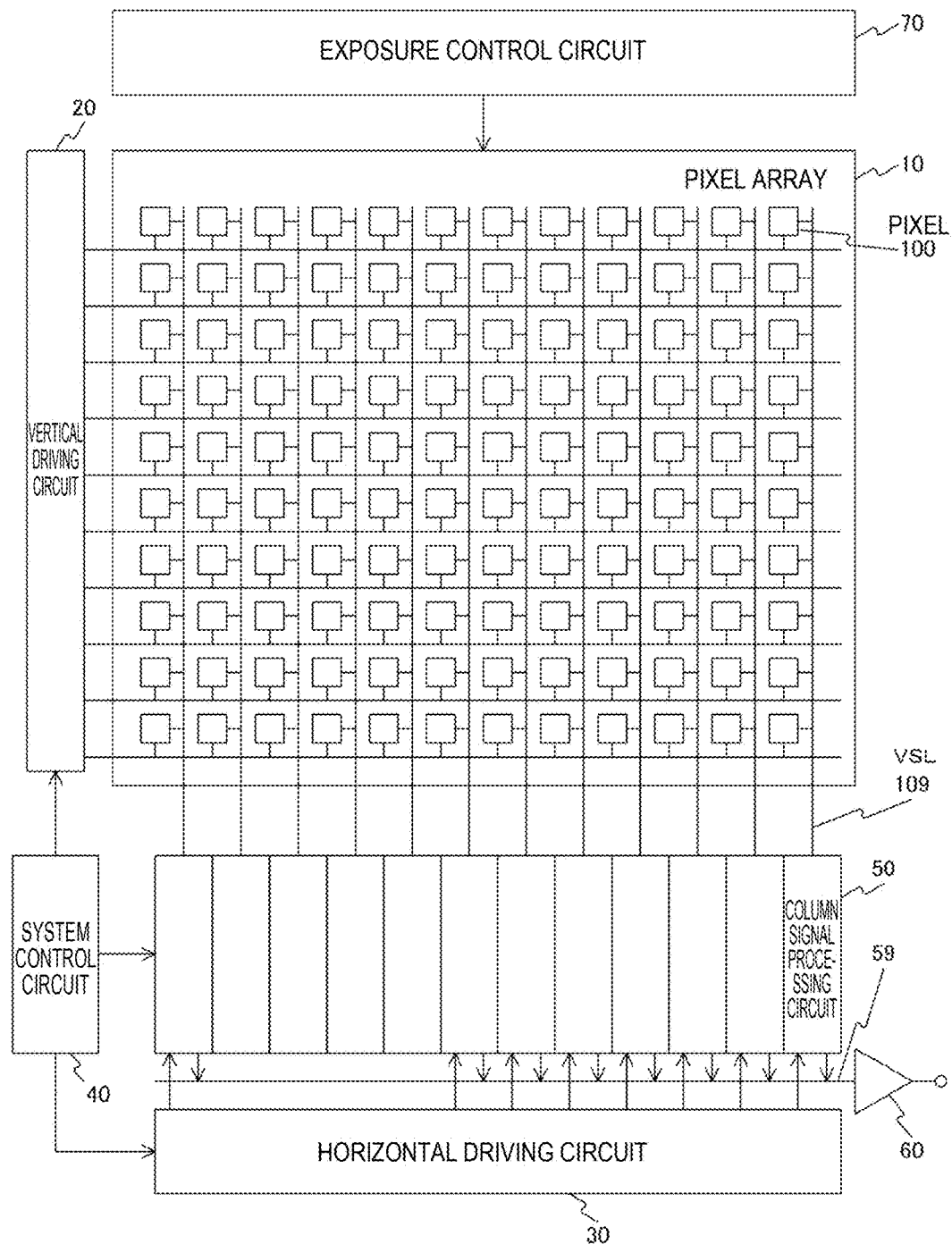
FIG. 1 is a diagram showing an example of a configuration of a solid-state imaging device in an embodiment of the present technology.

FIG. 1 is a diagram showing an example of the configuration of a solid-state imaging device in an embodiment of the present technology. The solid-state imaging device includes a pixel array 10 and a peripheral circuit section. The peripheral circuit section includes a vertical driving circuit 20, a horizontal driving circuit 30, a system control circuit 40, column signal processing circuits 50, an output circuit 60, and an exposure control circuit 70. Note that the vertical driving circuit 20, the horizontal driving circuit 30, the system control circuit 40, the column signal processing circuit 50, and the output circuit 60 are an example of a reading circuit according to an embodiment of the present technology.

The pixel array 10 is a pixel array in which a plurality of pixels 100 each including a photoelectric conversion section are arranged in a two-dimensional array form. As described later, the pixel 100 includes, for example, a photodiode serving as a photoelectric conversion section and a plurality of pixel transistors.

The vertical driving circuit 20 drives the pixel 100 in units of rows. The vertical driving circuit 20 includes, for example, a shift register. The vertical driving circuit 20 selects a pixel driving interconnection, and supplies a pulse for driving the pixel 100 to the selected pixel driving interconnection. Thereby, the vertical driving circuit 20 selectively scans the pixels 100 of the pixel array 10 sequentially in the vertical direction in units of rows, and outputs a pixel signal based on a signal charge that is generated in accordance with incident light in the photoelectric conversion section of the pixel 100, via a vertical signal line (VSL) 109.

The horizontal driving circuit 30 drives the column signal processing circuit 50 in units of columns. The horizontal driving circuit 30 includes, for example, a shift register. The horizontal driving circuit 30 sequentially outputs horizontal scanning pulses and thereby selects all the column signal processing circuits 50 one after another, and causes a pixel signal to be outputted from each of the column signal processing circuits 50 to a horizontal signal line 59.

The system control circuit 40 controls reading processing in the solid-state imaging device. The system control circuit 40 receives an input clock and data that command the operating mode etc., and outputs data such as inside information of the solid-state imaging device. That is, on the basis of a vertical synchronization signal, a horizontal synchronization signal, and a master clock, the system control circuit 40 generates a clock signal and a control signal serving as standards of each of the operations of the vertical driving circuit 20, the column signal processing circuit 50, the horizontal driving circuit 30, etc. Then, the system control circuit 40 inputs these signals to the vertical driving circuit 20, the column signal processing circuit 50, the horizontal driving circuit 30, etc.

The column signal processing circuit 50 is placed for, for example, each column of pixels 100, and performs signal processing such as denoising on a signal outputted from the pixel 100 of one row via the vertical signal line 109, on a pixel column basis. That is, the column signal processing circuit 50 performs signal processing such as correlated double sampling (CDS) for removing fixed pattern noise proper to the pixel 100, signal amplification, and analog-to-digital (A/D) conversion. Note that, in the output stage of the column signal processing circuit 50, a not-illustrated horizontal selection switch is connected in a part leading to the horizontal signal line 59.

The output circuit 60 performs signal processing on signals sequentially supplied from the column signal processing circuits 50 via the horizontal signal line 59, and outputs the processed signals. In this event, the output circuit 60 buffers the signal sent from the column signal processing circuit 50. Further, the output circuit 60 may perform black level adjustment, column variation correction, various pieces of digital signal processing, etc. on the signal sent from the column signal processing circuit 50.

The exposure control circuit 70 controls exposure in the plurality of pixels 100 of the pixel array 10. The exposure control circuit 70 supplies, to each of the pixels 100, a selection signal that designates one of the plurality of pixels 100 in the pixel array 10, and performs the control of exposure in units of the pixel 100. A connection relationship between the exposure control circuit 70 and the pixel 100 is described with reference to the next drawing.

Figure 2:
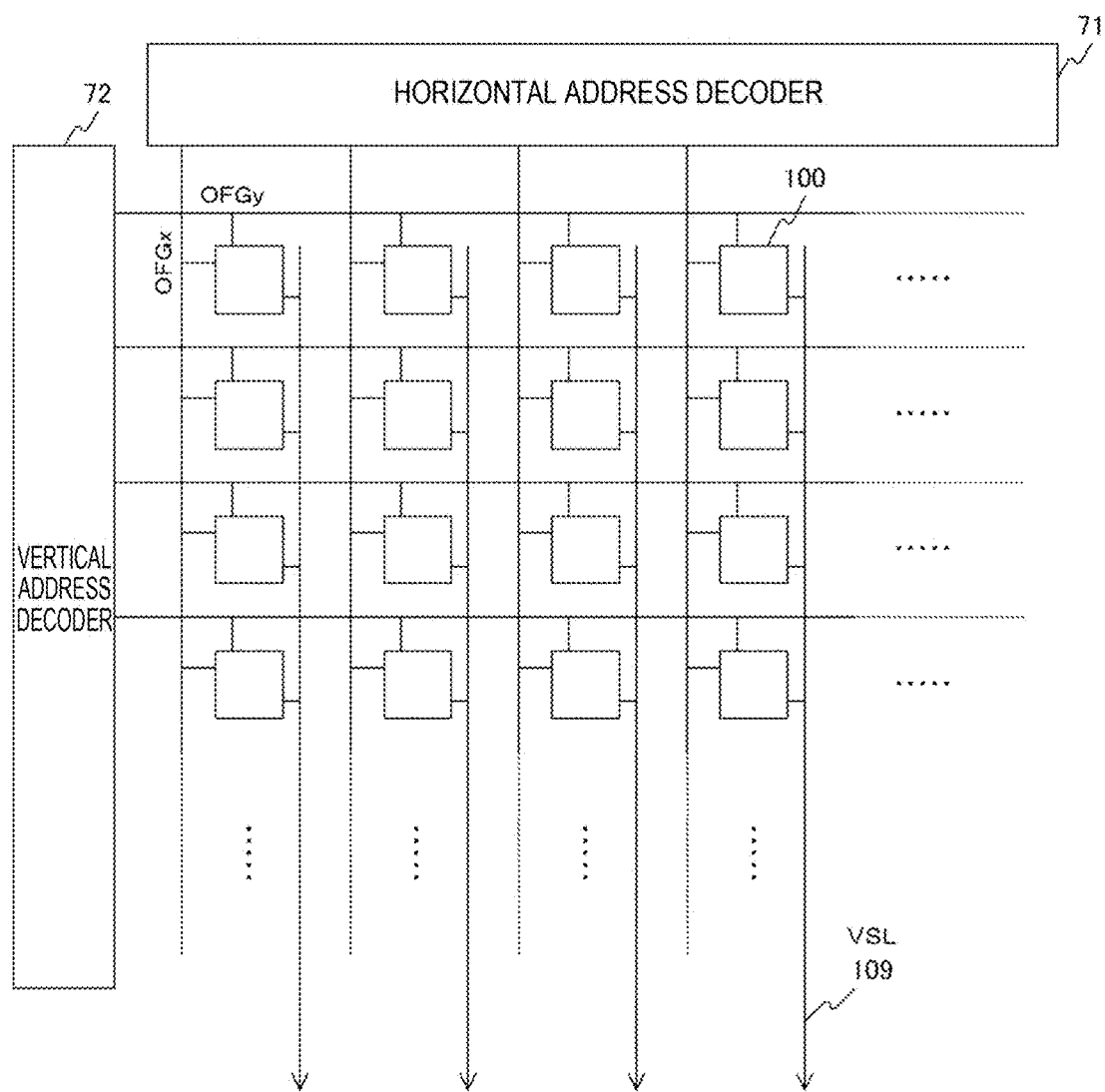
FIG. 2 is a diagram showing an example of a relationship between an exposure control circuit 70 and a pixel 100 in an embodiment of the present technology.

FIG. 2 is a diagram showing an example of a relationship between the exposure control circuit 70 and the pixel 100 in an embodiment of the present technology.

The exposure control circuit 70 includes a horizontal address decoder 71 and a vertical address decoder 72. The horizontal address decoder 71 is a decoder that decodes the position in the horizontal direction of the pixel address in the pixel array 10. The output of the horizontal address decoder 71 is supplied to the pixel 100 as a horizontal address signal OFGx. Note that the horizontal address is also referred to as a column address.

The vertical address decoder 72 is a decoder that decodes the position in the vertical direction of the pixel address in the pixel array 10. The output of the vertical address decoder 72 is supplied to the pixel 100 as a vertical address signal OFGy. Note that the vertical address is also referred to as a row address.

Each of the pixels 100 includes terminals for receiving the horizontal address signal OFGx and the vertical address signal OFGy. Thereby, the pixel 100 can receive control for exposure in units of pixels from the exposure control circuit 70. Note that the horizontal address signal OFGx and the vertical address signal OFGy are examples of a selection signal according to an embodiment of the present technology.

[Circuit Configuration]

Figure 3:
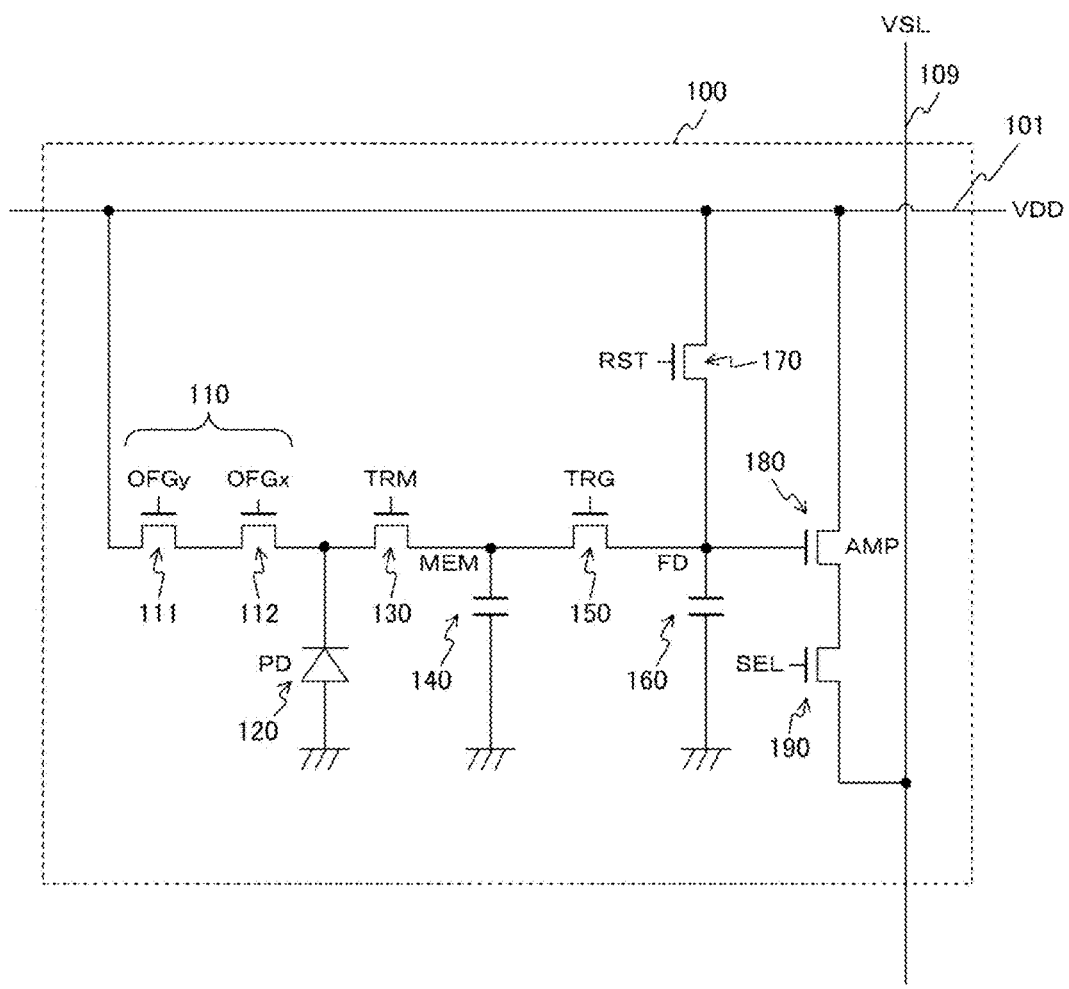
FIG. 3 is a diagram showing an example of a circuit configuration of the pixel 100 in a first embodiment of the present technology.

FIG. 3 is a diagram showing an example of a circuit configuration of the pixel 100 in a first embodiment of the present technology.

The pixel 100 includes a photoelectric conversion section 120, a first charge transfer section 130, a charge retention section 140, a second charge transfer section 150, a charge/voltage conversion section 160, a charge resetting section 170, a signal amplifying section 180, a pixel selection section 190, and charge release sections 111 and 112. Further, the pixel 100 includes selection signal terminals 110 that receive the horizontal address signal OFGx and the vertical address signal OFGy.

The photoelectric conversion section 120 is, for example, a p-n junction photodiode (PD), and generates and stores a charge in accordance with the amount of incident light. Note that the photoelectric conversion section 120 may be an embedded structure.

The first charge transfer section 130 transfers the charge stored in the photoelectric conversion section 120 to the charge retention section 140, in accordance with a transfer signal TRM. If the transfer signal TRM applied to the first charge transfer section 130 becomes effective (an H level), the first charge transfer section 130 enters a conduction state, and the charge stored in the photoelectric conversion section 120 is transferred to the charge retention section 140. Note that, also in the following description, electric potential levels indicating effectiveness are referred to as the H level; these levels may be supplied by a common signal line, or at least one of them may be supplied separately.

The charge retention section 140 is a capacitance of a diffusion region MEM formed between the drain of the first charge transfer section 130 and the source of the second charge transfer section 150. The charge retention section 140 retains the charge transferred from the first charge transfer section 130.

The second charge transfer section 150 transfers the charge retained in the charge retention section 140 to the charge/voltage conversion section 160, in accordance with a transfer signal TRG. If the transfer signal TRG applied to the second charge transfer section 150 becomes effective (the H level), the second charge transfer section 150 enters a conduction state, and the charge retained in the charge retention section 140 is transferred to the charge/voltage conversion section 160.

The charge/voltage conversion section 160 is a floating diffusion (FD) capacitance formed between the drain of the second charge transfer section 150 and the source of the charge resetting section 170. The charge/voltage conversion section 160 stores the charge transferred from the second charge transfer section 150.

The charge resetting section 170 resets the charge stored in the charge/voltage conversion section 160, in accordance with a resetting signal RST. If the resetting signal RST applied to the charge resetting section 170 becomes effective (the H level), the charge resetting section 170 enters a conduction state, and the charge stored in the charge/voltage conversion section 160 is reset.

The signal amplifying section 180 amplifies the charge stored in the charge/voltage conversion section 160, and outputs a pixel signal at a level in accordance with the charge. The gate electrode of the signal amplifying section 180 is connected to the charge/voltage conversion section 160, and the drain of the signal amplifying section 180 is connected to a power supply voltage VDD; and the signal amplifying section 180 amplifies and reads the charge obtained by photoelectric conversion in the photoelectric conversion section 120.

The pixel selection section 190 selects one pixel 100 in the pixel array 10. The pixel selection section 190 is connected between the source of the signal amplifying section 180 and the vertical signal line 109, and a selection signal SEL is supplied to the gate electrode of the pixel selection section 190. If the selection signal SEL becomes effective (the H level), the pixel selection section 190 enters a conduction state, and the pixel enters what is called a selection state. If the pixel is set to the selection state, a signal outputted from the signal amplifying section 180 is read out to the column signal processing circuit 50 via the vertical signal line 109.

The charge release sections 111 and 112 release the charge stored in the photoelectric conversion section 120, in accordance with the horizontal address signal OFGx and the vertical address signal OFGy. If the vertical address signal OFGy applied to the charge release section 111 becomes effective (the H level) and furthermore the horizontal address signal OFGx applied to the charge release section 112 becomes effective (the H level), both sections enter a conduction state. Thereby, the charge stored in the photoelectric conversion section 120 is released via the power supply voltage VDD.

As described above, the horizontal address signal OFGx and the vertical address signal OFGy have been supplied from the exposure control circuit 70 on a pixel basis; thereby, the release control of the charge stored in the photoelectric conversion section 120 can be performed on a pixel basis. The period from the timing at which the release of the charge is performed to the time at which the transfer signal TRM becomes effective (the H level) and the subsequent charge is transferred to the charge retention section 140 is the accumulation time of the photoelectric conversion section 120. The timing of transfer to the charge retention section 140 is the same in the entire images; thus, the accumulation time can be selectively controlled by the timing at which the release of the charge is performed.

[Circuit Layout]

Figure 4:
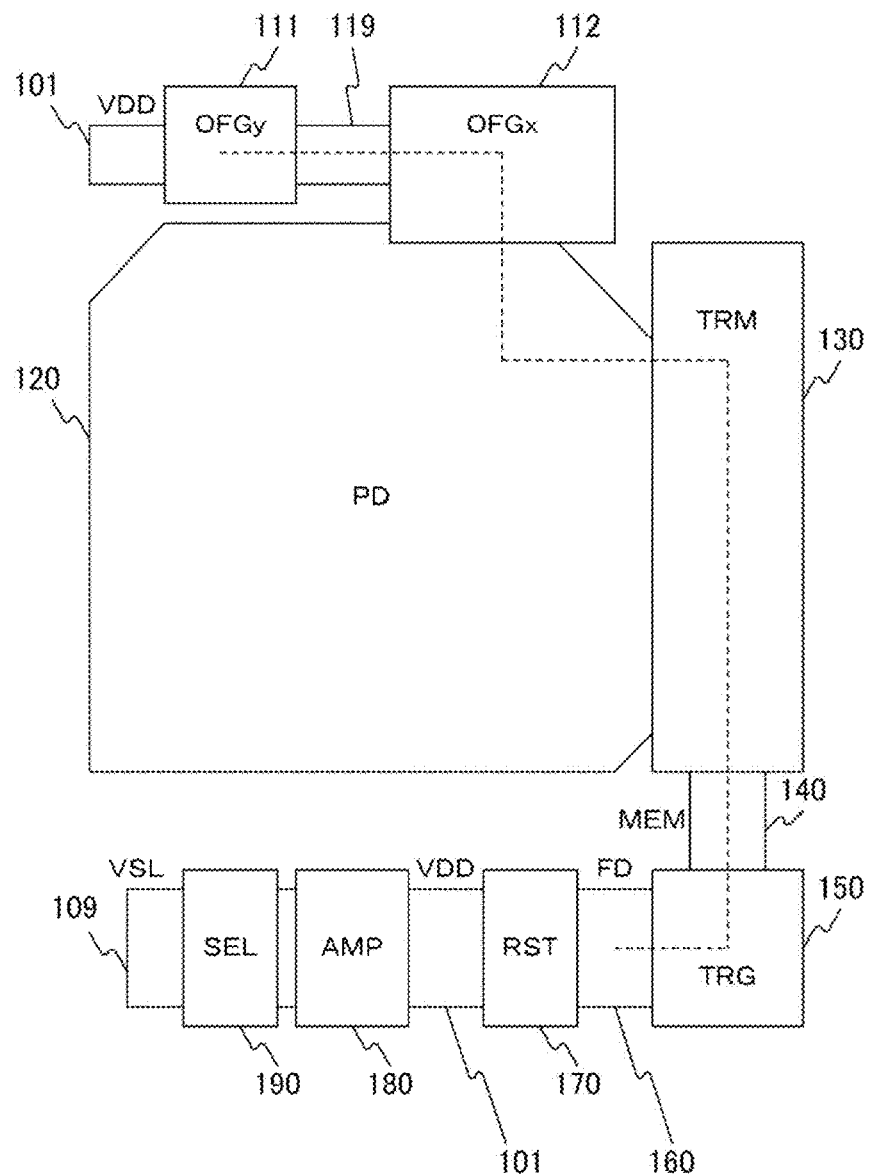
FIG. 4 is a diagram showing an example of a planar view of the pixel 100 in the first embodiment of the present technology.
Figure 5:
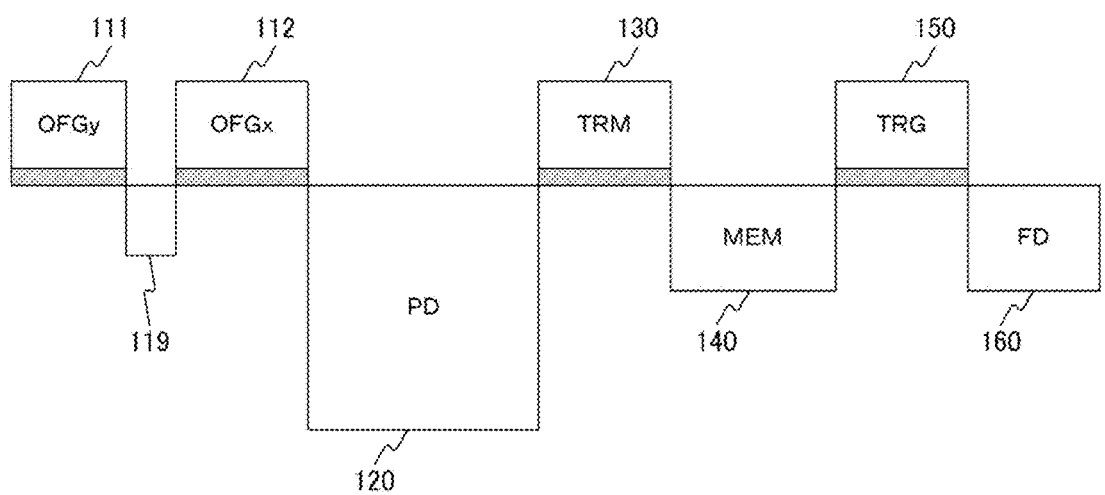
FIG. 5 is a diagram showing an example of a cross-sectional view of the pixel 100 in the first embodiment of the present technology.

FIG. 4 is a diagram showing an example of a planar view of the pixel 100 in the first embodiment of the present technology. FIG. 5 is a diagram showing an example of a cross-sectional view of the pixel 100 in the first embodiment of the present technology. Here, FIG. 5 shows a cross section taken along the dotted line in FIG. 4.

In this pixel 100, the charge release sections 111 and 112, the first charge transfer section 130, the second charge transfer section 150, the charge resetting section 170, the signal amplifying section 180, and the pixel selection section 190 are placed around the photoelectric conversion section 120 as the center. Each of these surrounding sections includes, for example, a metal-oxide-semiconductor field effect transistor (MOSFET), in which an oxide insulating film is formed under the gate electrode.

The power supply voltage VDD is connected to the drain of the charge release section 111. The charge release sections 111 and 112 are connected in series, and a diffusion layer 119 exists between both. If the vertical address signal OFGy applied to the charge release section 111 becomes effective (the H level) and furthermore the horizontal address signal OFGx applied to the charge release section 112 becomes effective (the H level), both enter a conduction state.

Thereby, the charge stored in the photoelectric conversion section 120 is released via the power supply voltage VDD.

The charge retention section 140 is formed between the drain of the first charge transfer section 130 and the source of the second charge transfer section 150. If the transfer signal TRM applied to the first charge transfer section 130 becomes effective (the H level), the first charge transfer section 130 enters a conduction state, and the charge stored in the photoelectric conversion section 120 is transferred to the charge retention section 140.

The charge/voltage conversion section 160 is formed between the drain of the second charge transfer section 150 and the source of the charge resetting section 170. If the transfer signal TRG applied to the second charge transfer section 150 becomes effective (the H level), the second charge transfer section 150 enters a conduction state, and the charge retained in the charge retention section 140 is transferred to the charge/voltage conversion section 160.

[Exposure Control]

Figure 6:
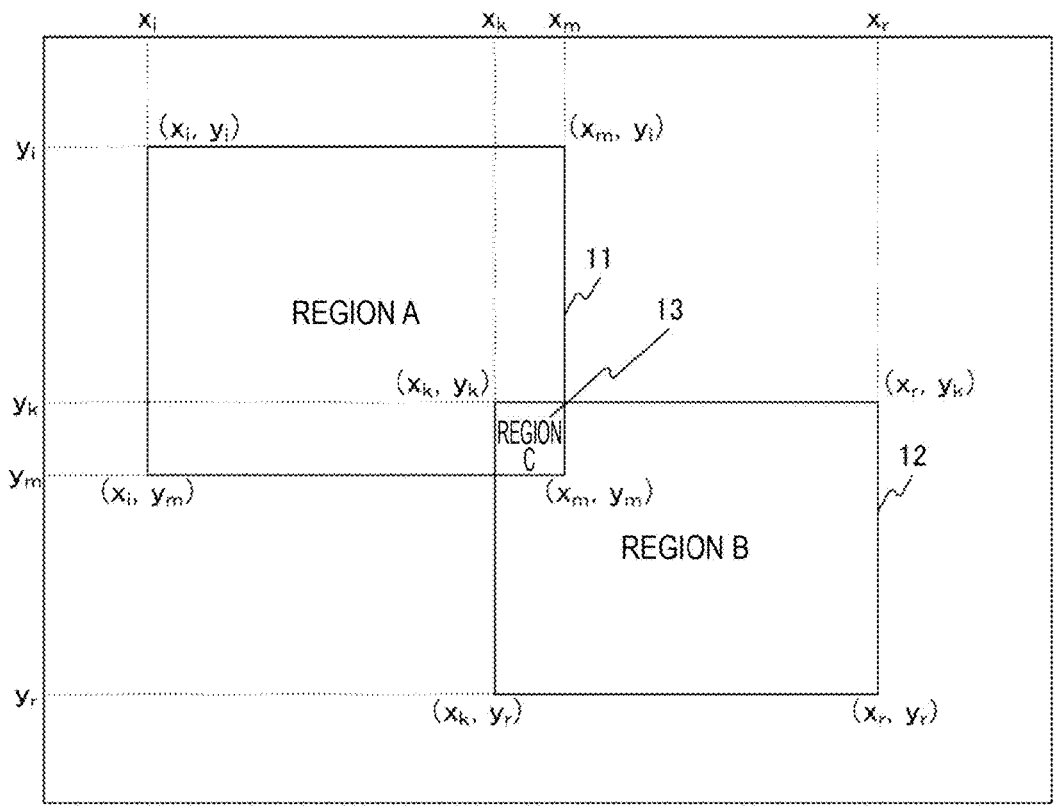
FIG. 6 is a diagram showing examples of a region of interest ROI envisaged in an embodiment of the present technology.

FIG. 6 is a diagram showing examples of the region of interest ROI envisaged in an embodiment of the present technology.

In this example, region A (11) and region B (12) in an image are taken as regions of interest ROIs, and a portion where both overlap is defined as region C (13). Region A is a rectangle region from coordinates $(x_i, y_i)$ at the upper left to coordinates $(x_m, y_m)$ at the lower right. Region B is a rectangle region from coordinates $(x_k, y_k)$ at the upper left to coordinates $(x_r, y_r)$ at the lower right. The overlapping of both regions has occurred in region C that is a rectangle region from coordinates $(x_k, y_k)$ at the upper left to coordinates $(x_m, y_m)$ at the lower right.

Here, it is assumed that, in region A, imaging is performed at a high resolution while the accumulation time for exposure is set long. On the other hand, it is assumed that, in region B, imaging is performed at a low resolution while the accumulation time for exposure is set short. In this event, the accumulation time of region C where both regions overlap is rate-determined by the accumulation time of region B.

FIG. 7 is a diagram showing examples of the relationship between signals and the accumulation time of the regions in an embodiment of the present technology. In the drawing, the lapse of time is shown in the right direction.

"a" in the drawing shows timings in region A. The horizontal address signal OFGx and the vertical address signal OFGy of each of the pixels from coordinates $(x_i, y_i)$ to $(x_m, y_m)$ falling under region A are effective (the H level) in a period up to time T1. Thereby, the charge accumulated in the photoelectric conversion section 120 up to that time point is released. After that, if the transfer signal TRM applied to the first charge transfer section 130 becomes effective (the H level) at time T3, the first charge transfer section 130 enters a conduction state. Thereby, the charge accumulated in the photoelectric conversion section 120 in the accumulation time from time T1 to time T3 is transferred to the charge retention section 140.

"b" in the drawing shows timings in region B. First, the horizontal address signal OFGx and the vertical address signal OFGy of each of the pixels from coordinates $(x_k, y_k)$ to $(x_m, y_m)$ overlapping with region A are effective (the H level) in a period up to time T1. Thereby, the charge accumulated in the photoelectric conversion section 120 up to that time point is released. Further, the horizontal address signal OFGx and the vertical address signal OFGy of each of the pixels from coordinates $(x_k, y_k)$ to $(x_r, y_r)$ of the entire region B are effective (the H level) again in a period up to time T2. Thereby, the charge accumulated in the photoelec-tric conversion section 120 up to that time point is released. After that, if the transfer signal TRM applied to the first charge transfer section 130 becomes effective (the H level) at time T3, the first charge transfer section 130 enters a conduction state. Thereby, the charge accumulated in the photoelectric conversion section 120 in the accumulation time from time T2 to time T3 is transferred to the charge retention section 140.

"c" in the drawing shows timings in region C. First, like in the other regions, the horizontal address signal OFGx and the vertical address signal OFGy of each of the pixels from coordinates $(x_k, y_k)$ to $(x_m, y_m)$ overlapping with region A are effective (the H level) in a period up to time T1, and the charge accumulated in the photoelectric conversion section 120 is released. Further, the horizontal address signal OFGx and the vertical address signal OFGy of each of the pixels from coordinates $(x_k, y_k)$ to $(x_m, y_m)$ of the entire region C are effective (the H level) again in a period up to time T2. Thereby, the charge accumulated in the photoelectric conversion section 120 up to that time point is released. After that, if the transfer signal TRM applied to the first charge transfer section 130 becomes effective (the H level) at time T3, the first charge transfer section 130 enters a conduction state. Thereby, the charge accumulated in the photoelectric conversion section 120 in the accumulation time from time T2 to time T3 is transferred to the charge retention section 140.

Thus, the timing at which the transfer signal TRM becomes effective (the H level) and the first charge transfer section 130 enters a conduction state is common to all the pixels; on the other hand, the timing at which the charge accumulated in the photoelectric conversion section 120 is released is controlled on a pixel basis by the exposure control circuit 70.

Figure 8:
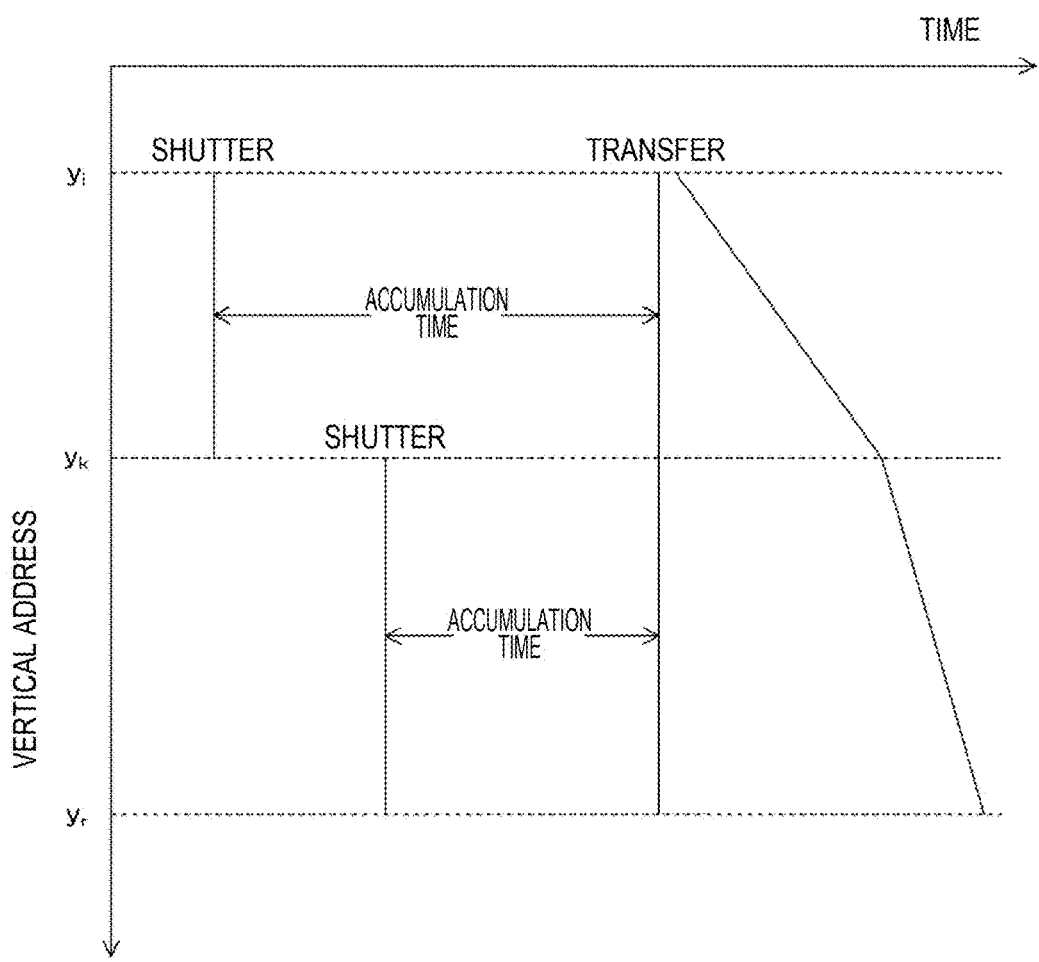
FIG. 8 is a diagram showing an example of a timing of reading from the pixel 100 in an embodiment of the present technology.

FIG. 8 is a diagram showing an example of the timing of reading from the pixel 100 in an embodiment of the present technology. The drawing shows the reading timing in the range of the horizontal address signal OFGx of $x_k$ to $x_m$; and shows the lapse of time in the right direction and shows the vertical address in the downward direction.

As described above, the accumulation time for exposure in the photoelectric conversion section 120 is controlled on a pixel basis. In this drawing, the timing at which the charge is finally released is shown as "SHUTTER." On the other hand, the timing at which the charge accumulated in the photoelectric conversion section 120 is transferred to the charge retention section 140 is shown as "TRANSFER."

After that, the charge retained in the charge retention section 140 is transferred to the charge/voltage conversion section 160 and is then read in units of rows, and the reading result is supplied to the column signal processing circuit 50 via the vertical signal line 109. In this example, reading at a high resolution is performed up to vertical address $y_k$. On the other hand, at or after vertical address $y_k$, a low resolution is envisaged, and reading by thinning-out is performed while rows on which reading is not performed are interposed. In the drawing, the line showing reading after transfer is continuous at or after vertical address $y_k$; however, in practice, although the line is continuous temporally, the line is discontinuous in the address direction because of reading by thinning-out. Note that this is an example, and region C may be read either at a high resolution or at a low resolution.

Thus, according to the first embodiment of the present technology, by controlling the charge release sections 111 and 112 with the vertical address signal OFGy and the horizontal address signal OFGx, accumulation control for exposure can be performed in units of pixels. Thereby, exposure control can be performed for each arbitrary region in an image.

Modification Examples

Figure 9:
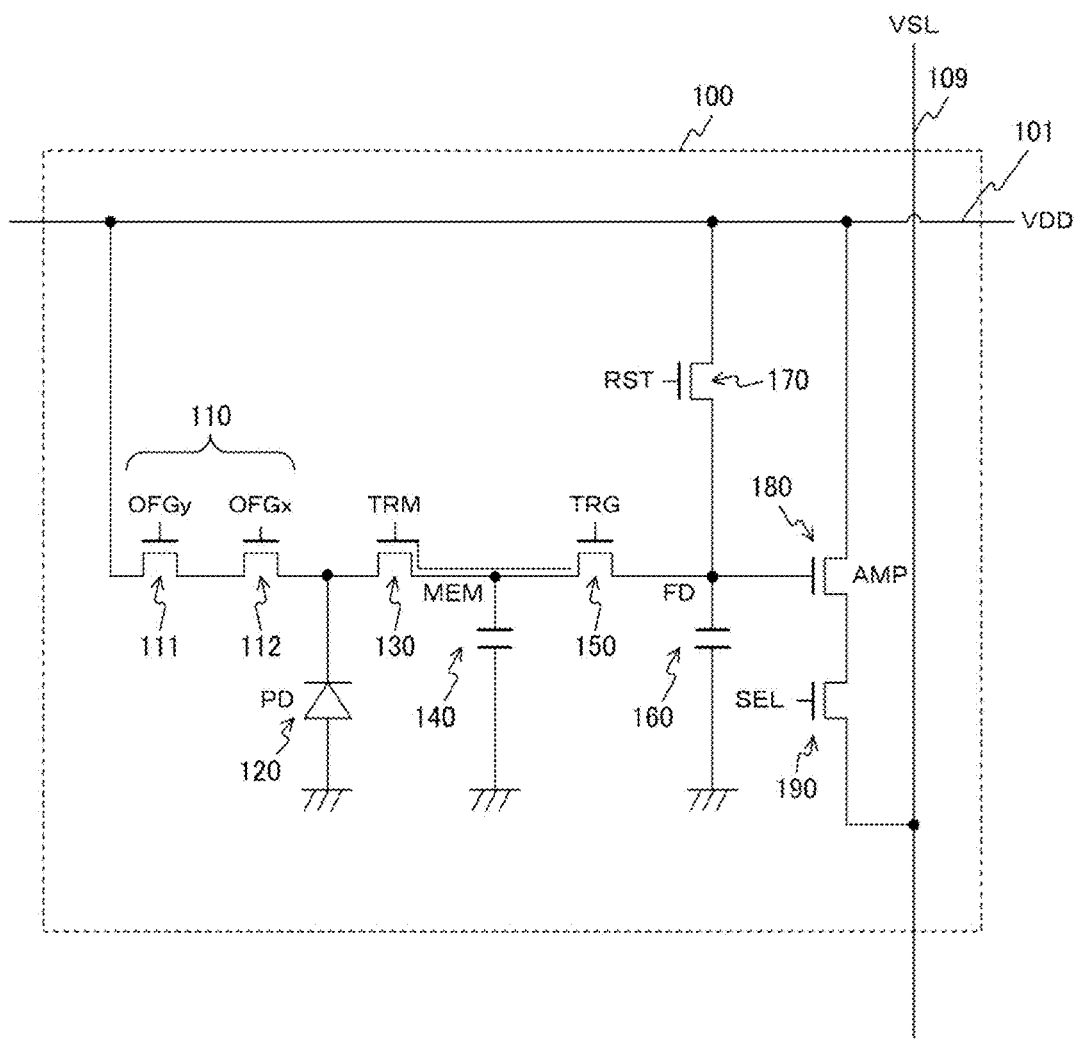
FIG. 9 is a diagram showing an example of a circuit configuration of the pixel 100 in a first modification example of the first embodiment of the present technology.

FIG. 9 is a diagram showing an example of a circuit configuration of the pixel 100 in a first modification example of the first embodiment of the present technology.

In the first embodiment described above, it is supposed that the charge retention section 140 is formed separately from the drain of the first charge transfer section 130. In contrast, in this modification example, it is supposed that the charge retention section 140 is formed integrally with a diffusion layer of the drain of the first charge transfer section 130. The other respects are similar to the first embodiment described above.

Figure 10:
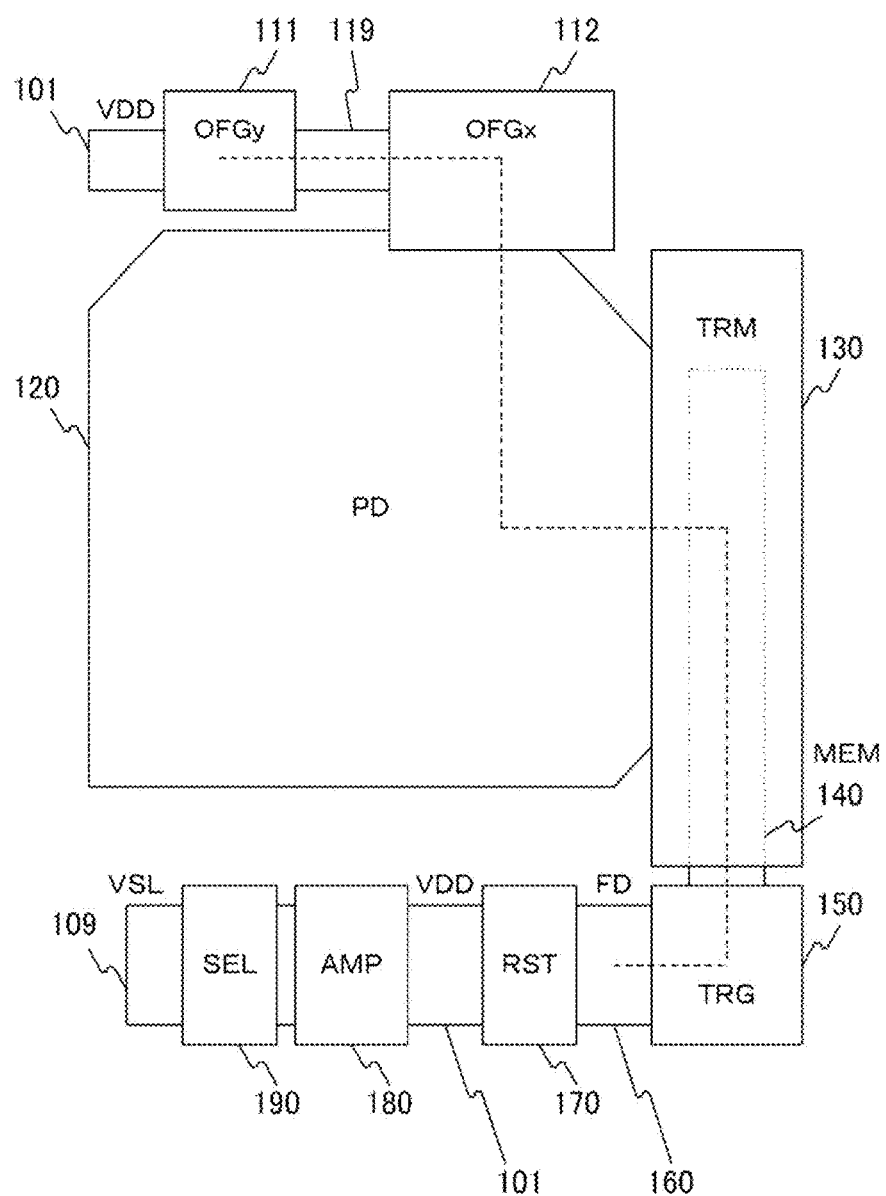
FIG. 10 is a diagram showing an example of a planar view of the pixel 100 in the first modification example of the first embodiment of the present technology.
Figure 11:
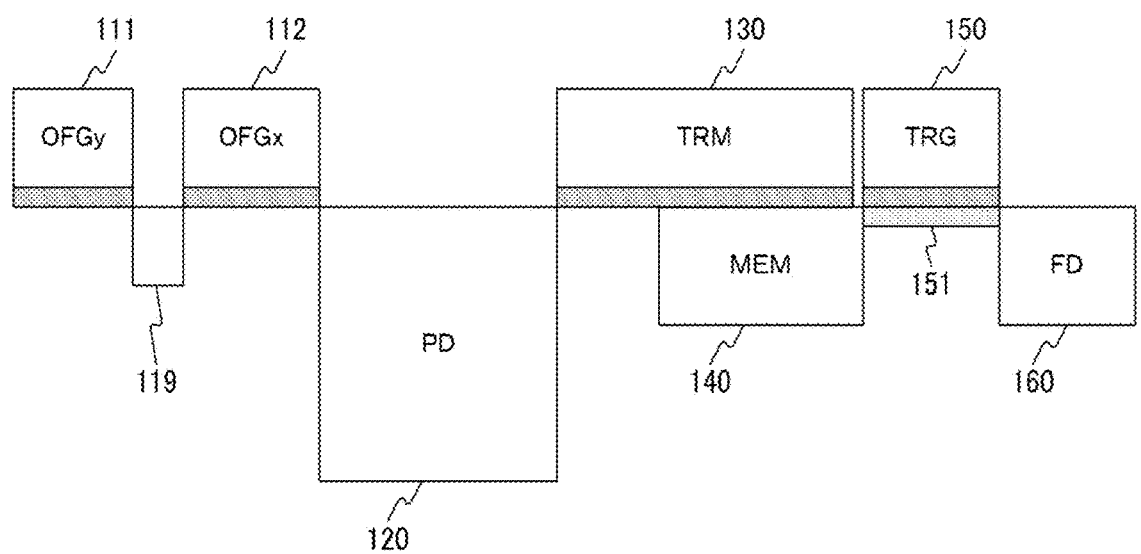
FIG. 11 is a diagram showing an example of a cross-sectional view of the pixel 100 in the first modification example of the first embodiment of the present technology.

FIG. 10 is a diagram showing an example of a planar view of the pixel 100 in the first modification example of the first embodiment of the present technology. FIG. 11 is a diagram showing an example of a cross-sectional view of the pixel 100 in the first modification example of the first embodiment of the present technology. Here, FIG. 11 shows a cross section taken along the dotted line in FIG. 10.

As described above, the charge retention section 140 is what is called an embedded-type memory that is formed integrally with a diffusion layer of the drain of the first charge transfer section 130. Herein, it is supposed that the drain of the charge retention section 140 and the charge/voltage conversion section 160 have an n-type. In this case, if the transfer signal TRG applied to the gate electrode of the second charge transfer section 150 becomes effective (the H level), a channel 151 is formed on the surface of the p-type semiconductor, and the charge is transferred. By this structure, dark current is suppressed, and good image quality can be obtained.

Figure 12:
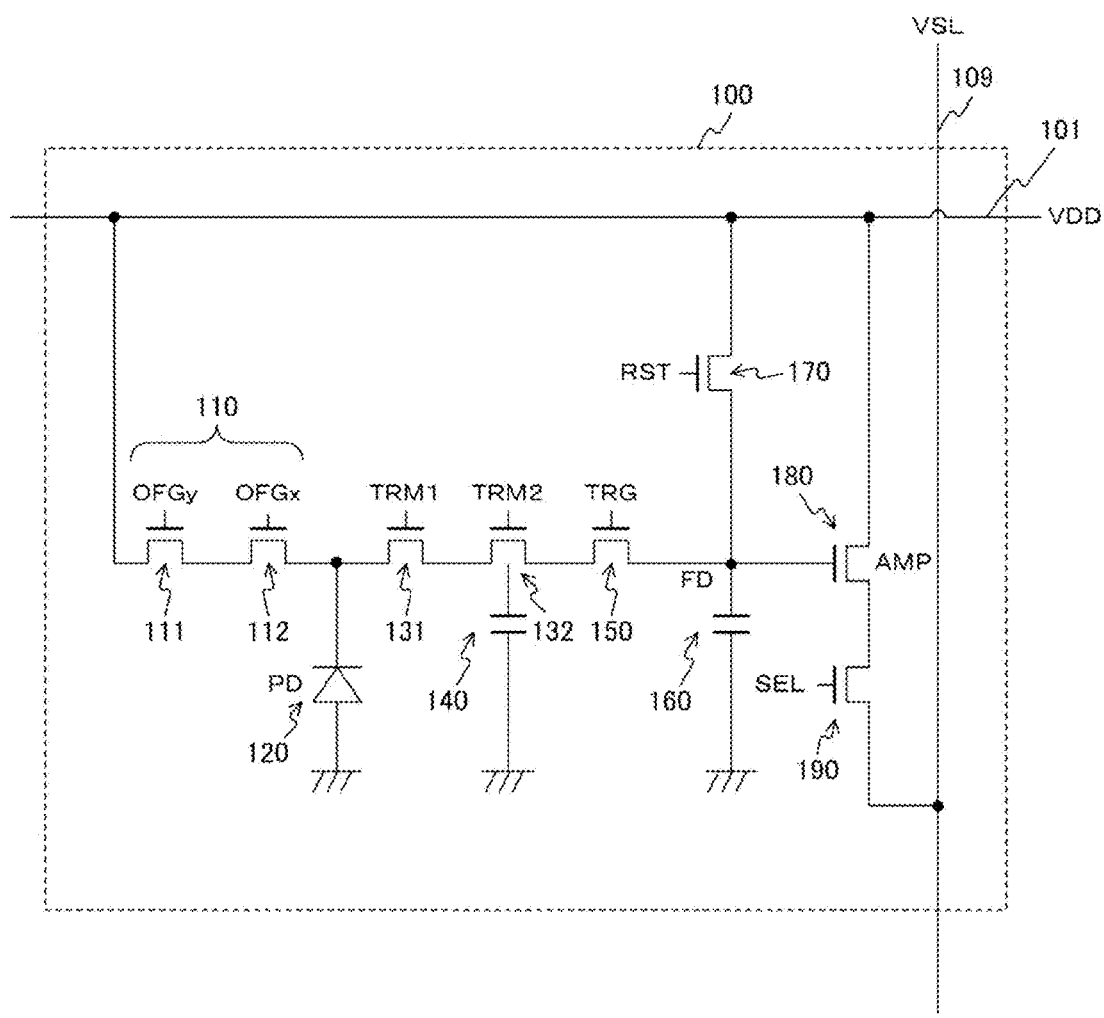
FIG. 12 is a diagram showing an example of a circuit configuration of the pixel 100 in a second modification example of the first embodiment of the present technology.

FIG. 12 is a diagram showing an example of a circuit configuration of the pixel 100 in a second modification example of the first embodiment of the present technology.

In the second modification example, the first charge transfer section 130 is divided into two charge transfer sections 131 and 132. In this case, if both of transfer signals TRM1 and TRM2 inputted to the gates of the two charge transfer sections 131 and 132 become effective (the H level), the charge transfer sections 131 and 132 enter a conduction state, and the charge stored in the photoelectric conversion section 120 is transferred to the charge retention section 140. Thus, the charge can be efficiently transferred by individually controlling the transfer signals TRM1 and TRM2 inputted to the gates of the two charge transfer sections 131 and 132. Further, as compared to a case of including one charge transfer section, the equality of the impurity concentration of the memory is maintained, and therefore the effect of the yield being increased is obtained.

2. Second Embodiment

In the first embodiment described above, the states of the horizontal address signal OFGx and the vertical address signal OFGy are detected by connecting the charge release sections 111 and 112 in series. As described above, the diffusion layer 119 exists between the charge release sections 111 and 112. Hence, if the horizontal address signal OFGx becomes effective (the H level) when the vertical address signal OFGy is ineffective (an L level), a charge may leak via the capacitance of the diffusion layer 119, and the signal-to-noise ratio (the S/N ratio) may be worsened. Thus, in a second embodiment, the transistors that receive the horizontal address signal OFGx and the vertical address signal OFGy are integrated into one piece in order to eliminate the diffusion layer 119 in the first embodiment.

[Circuit Configuration]

Figure 13:
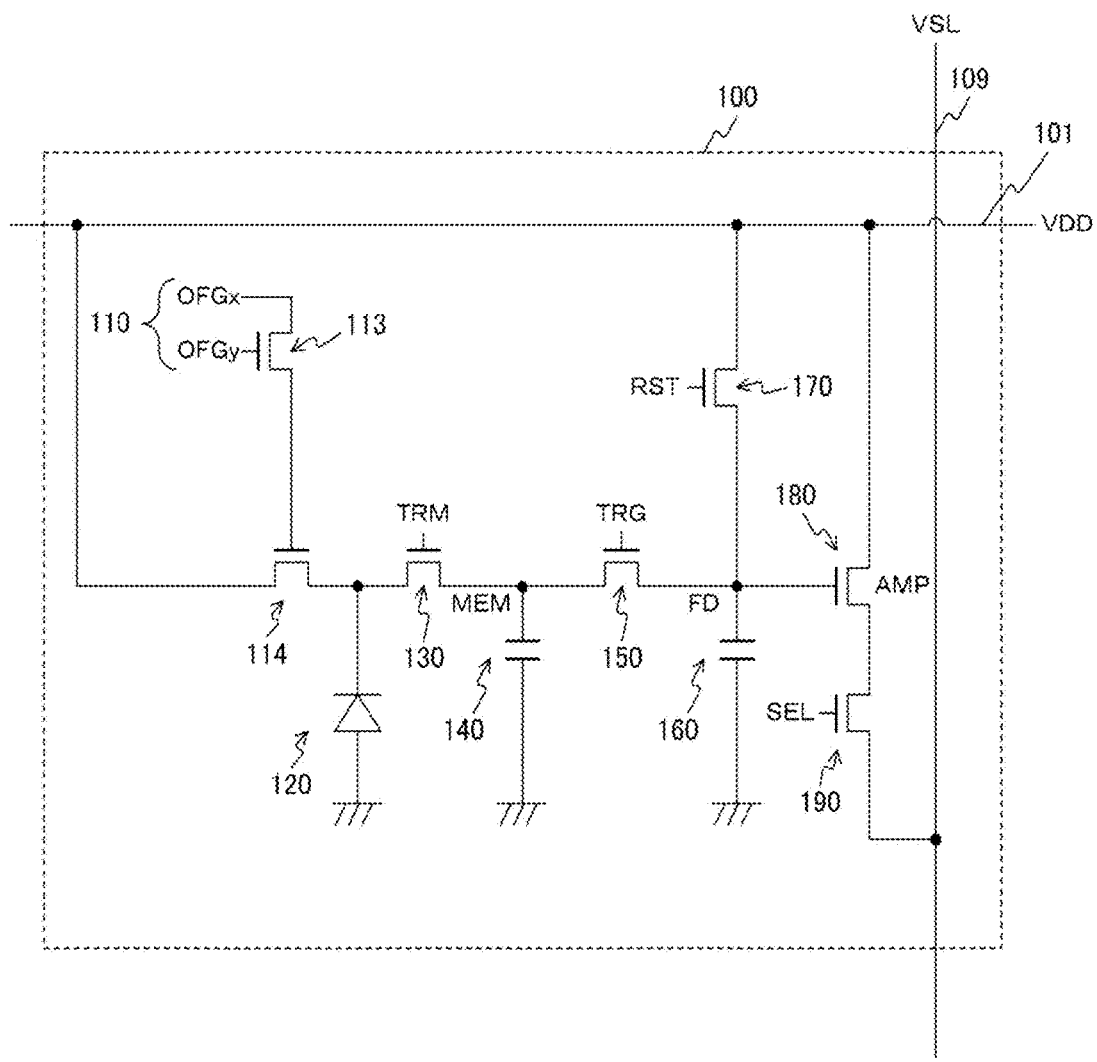
FIG. 13 is a diagram showing an example of a circuit configuration of the pixel 100 in a second embodiment of the present technology.

FIG. 13 is a diagram showing an example of a circuit configuration of the pixel 100 in the second embodiment of the present technology.

The pixel 100 in the second embodiment includes charge release sections 113 and 114 in place of the charge release sections 111 and 112 of the first embodiment. The configuration of the others is similar to the configuration of the first embodiment described above.

The charge release section 113 is a transistor in which the vertical address signal OFGy is connected to the gate and the horizontal address signal OFGx is connected to the drain. Thus, the charge release section 113 sets the source effective (the H level) when both of the horizontal address signal OFGx and the vertical address signal OFGy are effective (the H level), and sets the source ineffective (the L level) at other times. That is, the charge release section 113 generates the logical product of the horizontal address signal OFGx and the vertical address signal OFGy. The source of the charge release section 113 is connected to the gate of the charge release section 114, and the conduction of the charge release section 114 is controlled by a signal supplied from the source of the charge release section 113.

The charge release section 114 is a transistor that comes into conduction in accordance with a signal supplied from the source of the charge release section 113. The charge release section 114 is connected in series between the power supply voltage VDD and the photoelectric conversion section 120, and enters a conduction state if a signal supplied from the source of the charge release section 113 becomes effective (the H level). Thereby, the charge stored in the photoelectric conversion section 120 is released via the power supply voltage VDD. On the other hand, the charge release section 114 does not enter a conduction state if at least one of the horizontal address signal OFGx and the vertical address signal OFGy is ineffective (the L level).

Note that, although in the example described above the vertical address signal OFGy is connected to the gate and the horizontal address signal OFGx is connected to the drain in the charge release section 113, these may be connected conversely. That is, it is also possible to connect the horizontal address signal OFGx to the gate of the charge release section 113 and connect the vertical address signal OFGy to the drain of the charge release section 113.

[Circuit Layout]

Figure 14:
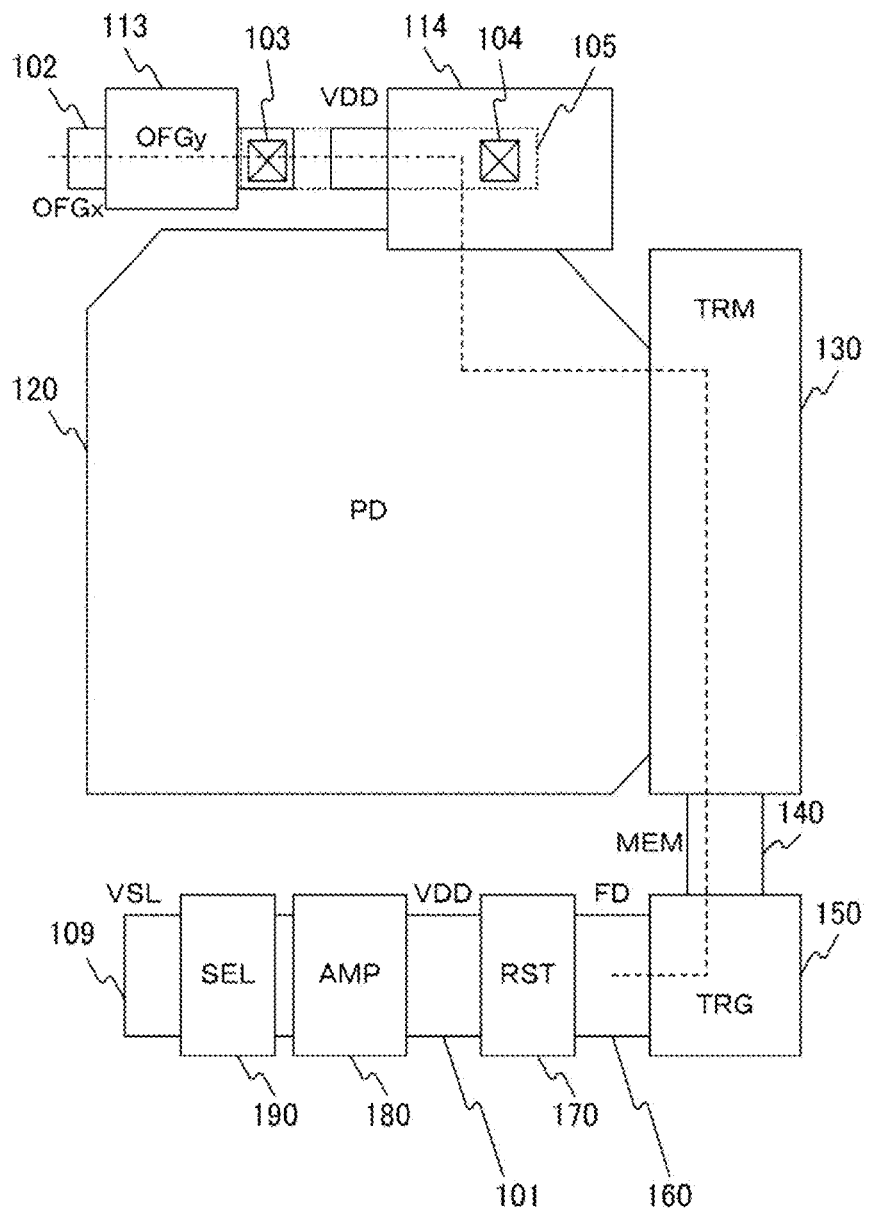
FIG. 14 is a diagram showing an example of a planar view of the pixel 100 in the second embodiment of the present technology.
Figure 15:
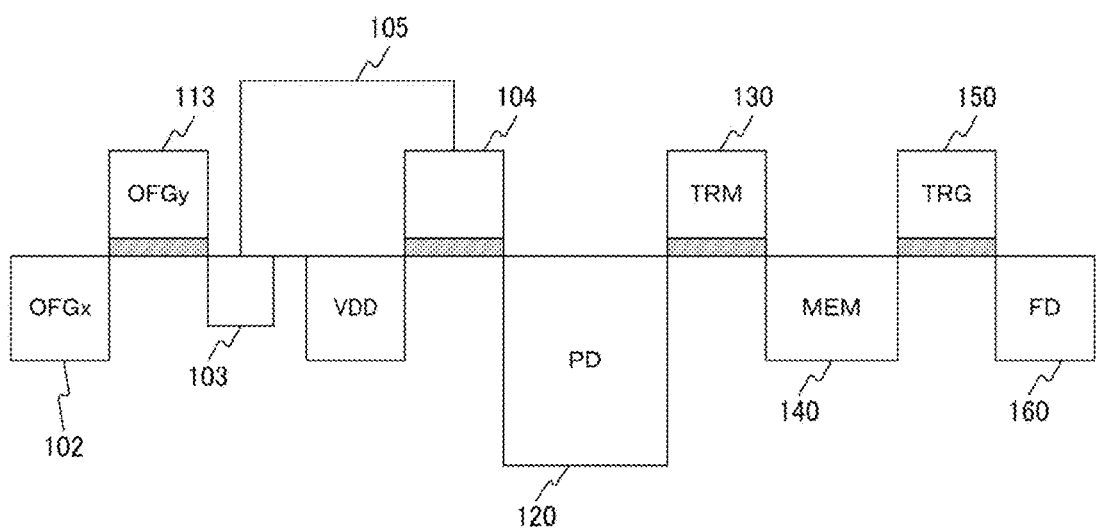
FIG. 15 is a diagram showing an example of a cross-sectional view of the pixel 100 in the second embodiment of the present technology.

FIG. 14 is a diagram showing an example of a planar view of the pixel 100 in the second embodiment of the present technology. FIG. 15 is a diagram showing an example of a cross-sectional view of the pixel 100 in the second embodiment of the present technology. Here, FIG. 15 shows a cross section taken along the dotted line in FIG. 14.

In the pixel 100 in the second embodiment, the charge release sections 113 and 114, the first charge transfer section 130, the second charge transfer section 150, the charge resetting section 170, the signal amplifying section 180, and the pixel selection section 190 are placed around the photoelectric conversion section 120 as the center.

In the charge release section 113, the horizontal address signal OFGx is connected to the drain, and the vertical address signal OFGy is connected to the gate. The power supply voltage VDD is supplied to one end of the charge release section 114. A contact 103 of the source of the charge release section 113 and a contact 104 of the gate of the charge release section 114 are connected together via a metal interconnection 105.

Figure 16:
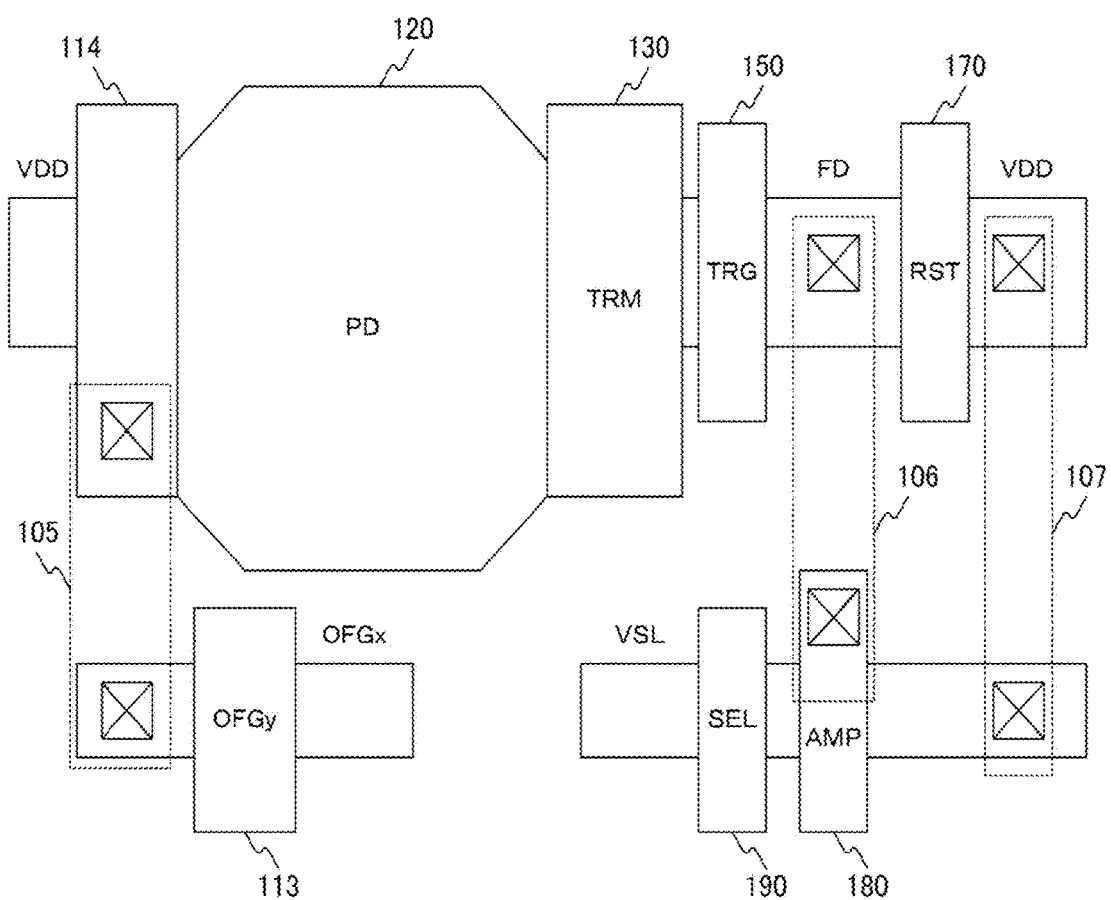
FIG. 16 is a diagram showing another example of a planar view of the pixel 100 in the second embodiment of the present technology.

FIG. 16 is a diagram showing another example of a planar view of the pixel 100 in the second embodiment of the present technology.

In this example, the charge release sections 113 and 114 and the first charge transfer section 130 are placed around the photoelectric conversion section 120 as the center. Further, the second charge transfer section 150 and the charge resetting section 170 are placed in the direction facing the photoelectric conversion section 120, and the signal amplifying section 180 and the pixel selection section 190 are placed.

Unlike in the example described above, the drain of the charge resetting section 170 and the drain of the signal amplifying section 180 are connected together via a metal interconnection 107. Note that, in the other drawings, the illustration of a metal interconnection 106 between the charge/voltage conversion section 160 and the gate of the signal amplifying section 180 is omitted, and the metal interconnection 106 is not particularly different.

Note that the vertical address signal OFGy and the horizontal address signal OFGx for controlling the accumulation time of exposure are similar to those of the first embodiment described above, and therefore a detailed description of exposure control is omitted.

Thus, according to the second embodiment of the present technology, by the vertical address signal OFGy and the horizontal address signal OFGx being receiving by the charge release section 113, the diffusion layer 119 in the first embodiment is eliminated, and the S/N ratio can be improved.

Modification Example

Figure 17:
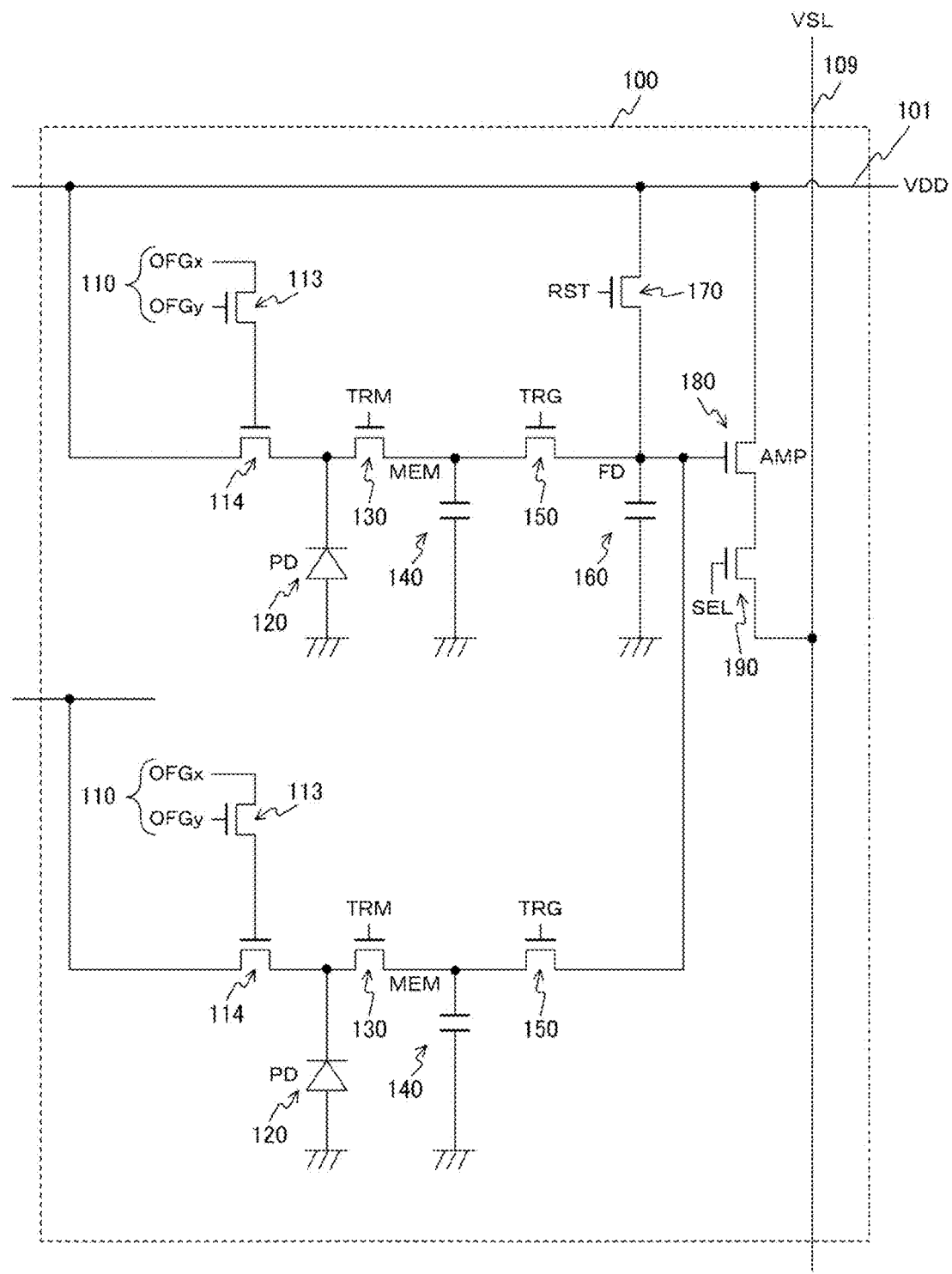
FIG. 17 is a diagram showing an example of a circuit configuration of the pixel 100 in a modification example of the second embodiment of the present technology.

FIG. 17 is a diagram showing an example of a circuit configuration of the pixel 100 in a modification example of the second embodiment of the present technology.

In this modification example, a structure in which two photoelectric conversion sections 120 in the second embodiment described above share one charge/voltage conversion section 160 is employed. The drains of the two different second charge transfer sections 150 share the same charge/voltage conversion section 160, and each of the second charge transfer sections 150 transfers the charge retained in the charge retention section 140 to the charge/voltage conversion section 160, in accordance with the respective transfer signal TRG.

Further, each of the numbers of charge resetting sections 170, signal amplifying sections 180, and pixel selection sections 190 connected to the charge/voltage conversion section 160 is one, and a structure in which also these are shared by a plurality of photoelectric conversion sections 120 is employed.

Figure 18:
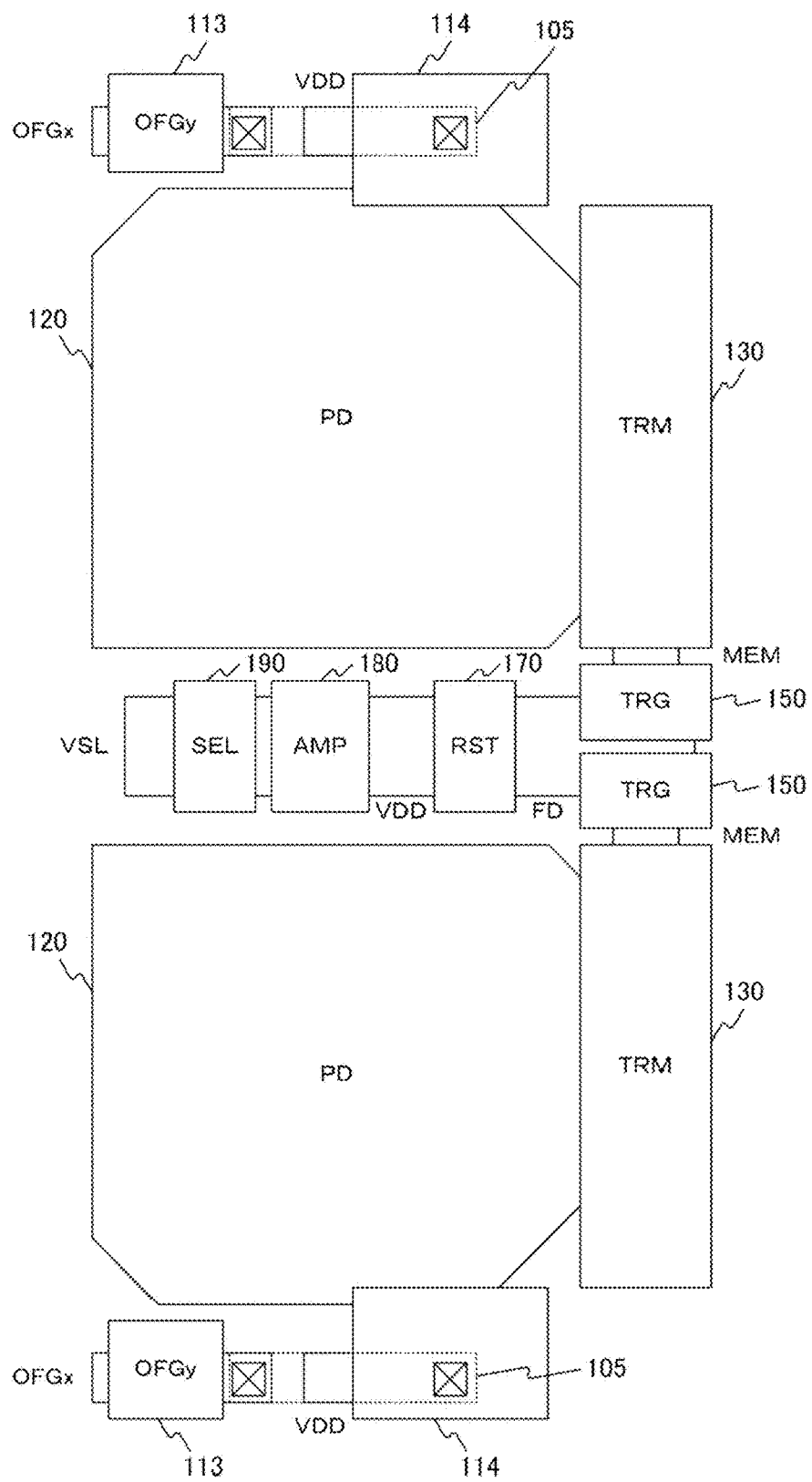
FIG. 18 is a diagram showing an example of a planar view of the pixel 100 in the modification example of the second embodiment of the present technology.

FIG. 18 is a diagram showing an example of a planar view of the pixel 100 in the modification example of the second embodiment of the present technology.

In this modification example, like in the second embodiment described above, the charge release sections 113 and 114, the first charge transfer section 130, the second charge transfer section 150, the charge resetting section 170, the signal amplifying section 180, and the pixel selection section 190 are placed around the photoelectric conversion section 120 as the center. However, the charge/voltage conversion section 160, the charge resetting section 170, the signal amplifying section 180, and the pixel selection section 190 are placed between the two photoelectric conversion sections 120, and have a structure of being shared by both.

In this modification example, by employing such a pixel-sharing structure, the area efficiency can be improved by reducing the circuit scale.

3. Third Embodiment

[Circuit Configuration]

Figure 19:
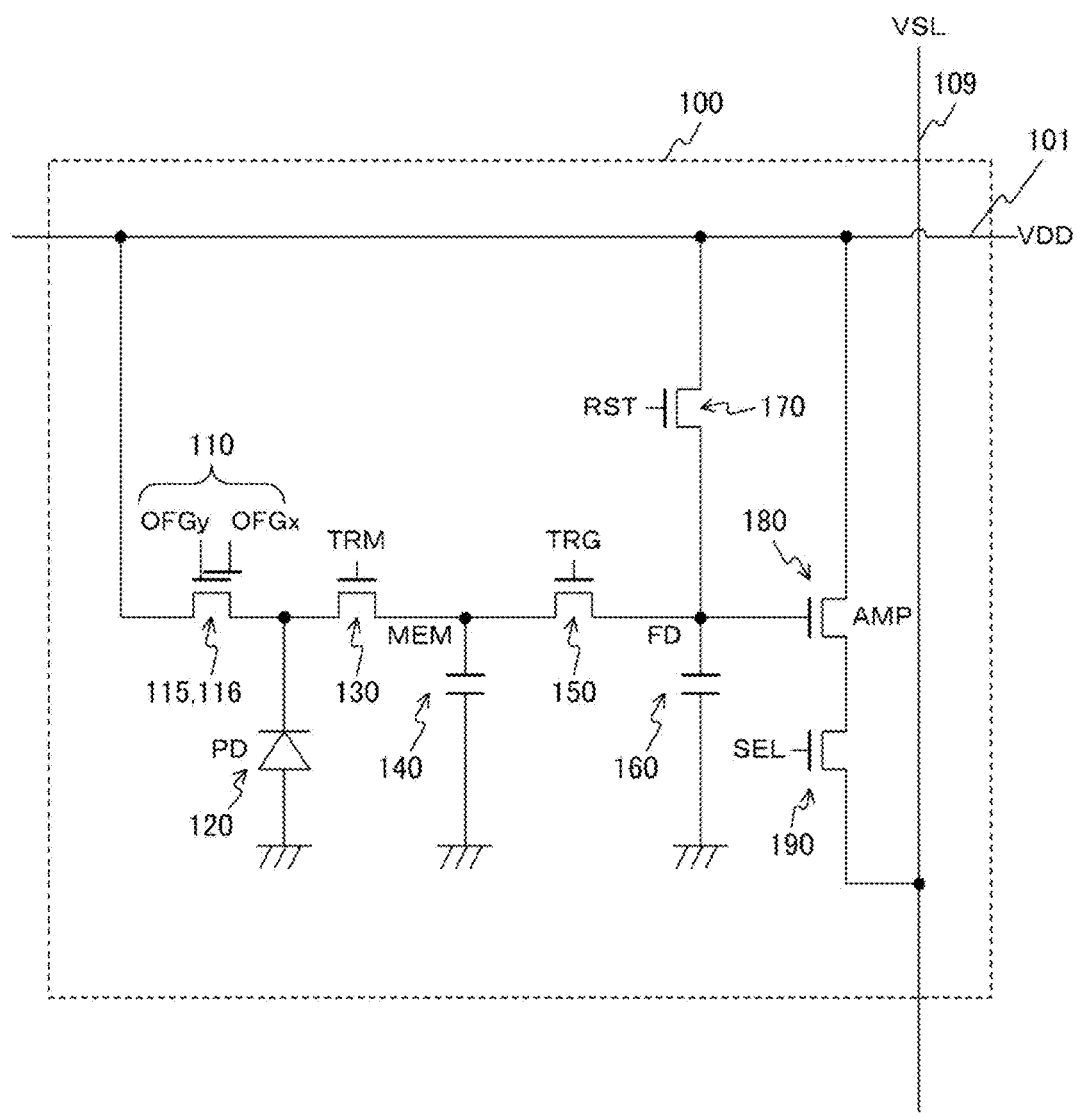
FIG. 19 is a diagram showing an example of a circuit configuration of the pixel 100 in a third embodiment of the present technology.

FIG. 19 is a diagram showing an example of a circuit configuration of the pixel 100 in a third embodiment of the present technology.

In the pixel 100 in the third embodiment, like in the second embodiment described above, the transistors that receive the horizontal address signal OFGx and the vertical address signal OFGy are integrated into one piece in order to eliminate the diffusion layer 119 in the first embodiment. That is, the pixel 100 in the third embodiment includes charge release sections 115 and 116 in place of the charge release sections 111 and 112 of the first embodiment. The configuration of the others is similar to the configuration of the first embodiment described above.

The charge release section 115 is a transistor in which the vertical address signal OFGy is connected to the gate. Further, the charge release section 116 is a transistor in which the horizontal address signal OFGx is connected to the gate. In the charge release sections 115 and 116, double gates are provided; although the gate electrode is different, the source and the drain are shared. Therefore, the charge release sections 115 and 116 enter a conduction state when both of the horizontal address signal OFGx and the vertical address signal OFGy are effective (the H level). The charge release sections 115 and 116 do not enter a conduction state if at least one of the horizontal address signal OFGx and the vertical address signal OFGy is ineffective (the L level). The charge release sections 115 and 116 are connected in series between the power supply voltage VDD and the photoelectric conversion section 120; if both of the horizontal address signal OFGx and the vertical address signal OFGy become effective (the H level), the charge stored in the photoelectric conversion section 120 is released via the power supply voltage VDD.

[Circuit Layout]

Figure 20:
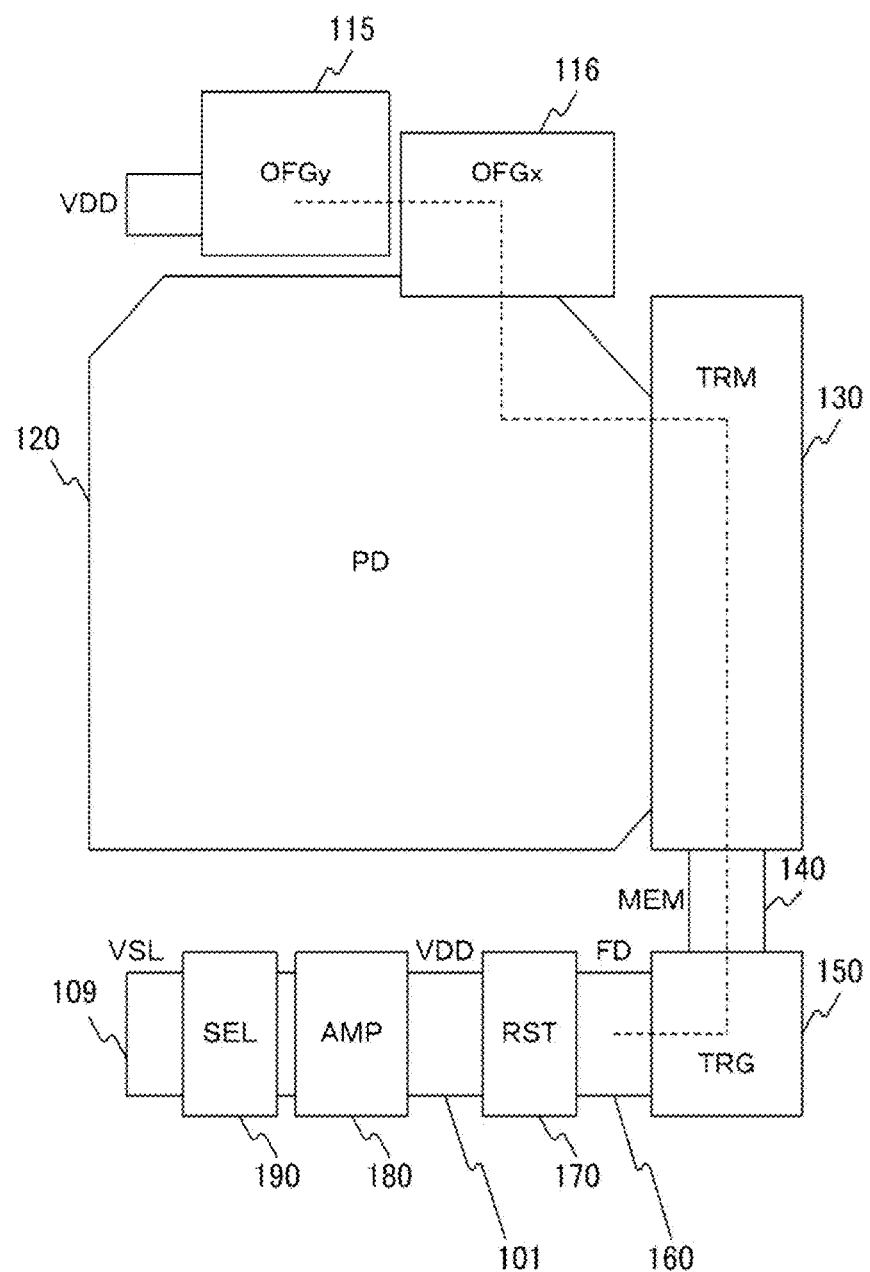
FIG. 20 is a diagram showing an example of a planar view of the pixel 100 in the third embodiment of the present technology.
Figure 21:
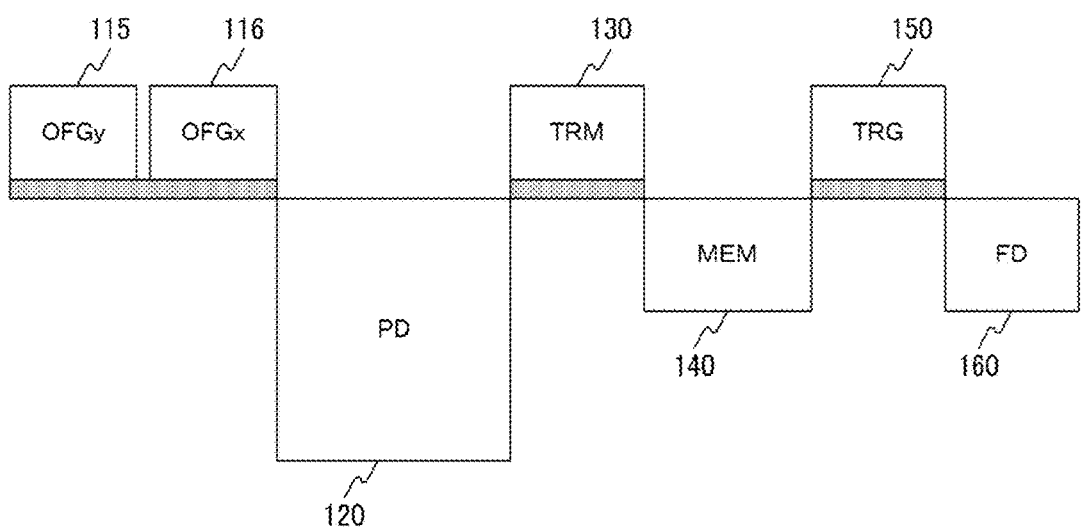
FIG. 21 is a diagram showing an example of a cross-sectional view of the pixel 100 in the third embodiment of the present technology.

FIG. 20 is a diagram showing an example of a planar view of the pixel 100 in the third embodiment of the present technology. FIG. 21 is a diagram showing an example of a cross-sectional view of the pixel 100 in the third embodiment of the present technology. Here, FIG. 21 shows a cross section taken along the dotted line in FIG. 20.

In the pixel 100 in the third embodiment, the charge release sections 115 and 116, the first charge transfer section 130, the second charge transfer section 150, the charge resetting section 170, the signal amplifying section 180, and the pixel selection section 190 are placed around the photoelectric conversion section 120 as the center.

The vertical address signal OFGy is connected to the gate of the charge release section 115. Further, the horizontal address signal OFGx is connected to the gate of the charge release section 116. The power supply voltage VDD is supplied to one end of the charge release section 115. If both of the horizontal address signal OFGx and the vertical address signal OFGy become effective (the H level), the charge stored in the photoelectric conversion section 120 is released via the power supply voltage VDD.

Thus, according to the third embodiment of the present technology, by the vertical address signal OFGy and the horizontal address signal OFGx being received by the charge release sections 115 and 116, the diffusion layer 119 in the first embodiment is eliminated, and the S/N ratio can be improved.

4. Fourth Embodiment

In the first to third embodiments described above, it is supposed that the photoelectric conversion section 120 and the charge release section are formed on the same substrate. However, the charge release section in these embodiments may not necessarily be formed on the same substrate. In a case where a solid-state imaging device has a structure in which a plurality of substrates are stacked, there is a possibility that the charge release section can be formed on a substrate different from the substrate of the photoelectric conversion section 120. Herein, a specific structure is considered.

[Substrates]

Figure 22:
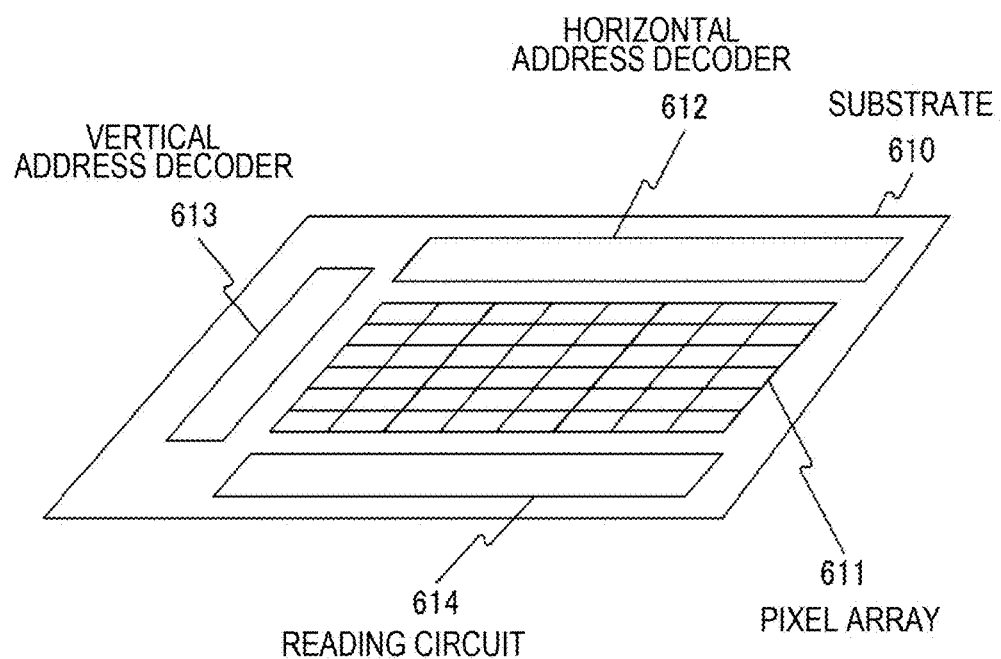
FIG. 22 is a diagram showing an example of an external appearance view in a case where a solid-state imaging device in an embodiment of the present technology is formed on one substrate.

FIG. 22 is a diagram showing an example of an external appearance view in a case where a solid-state imaging device in an embodiment of the present technology is formed on one substrate.

In this example, a pixel array 611 is placed on a central portion of a substrate 610, and a horizontal address decoder 612, a vertical address decoder 613, and a reading circuit 614 are placed around the pixel array 611.

On the other hand, in a structure in which a plurality of substrates are stacked, a back-side illumination type in which light is caused to be incident on a photoelectric conversion section from a side different from an interconnection layer is employed in many cases. In this case, it is desirable to attempt to reduce noise by forming a light blocking section in the following manner.

Figure 23:
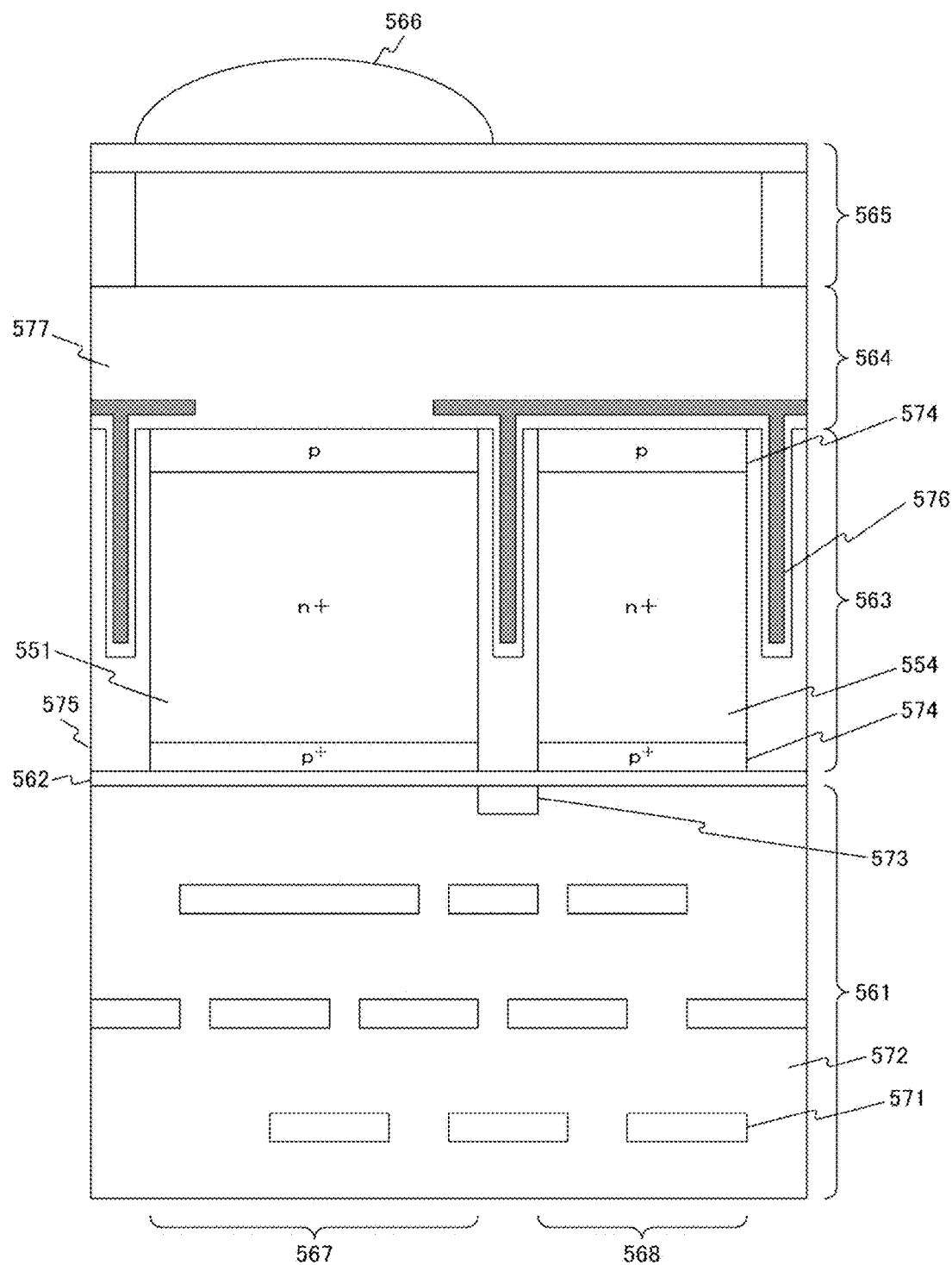
FIG. 23 is a diagram showing an example of a cross-sectional structure of a solid-state imaging device based on a back-side illumination type.

FIG. 23 is a diagram showing an example of a cross-sectional structure of a solid-state imaging device based on a back-side illumination type. In this example, an interconnection layer 561, an oxide film 562, a semiconductor substrate 563, a light blocking layer 564, a color filter layer 565, and an on-chip lens 566 are stacked in this order from the lower side. Further, a region of the semiconductor substrate 563 where a photoelectric conversion section 551 is formed is a photoelectric conversion region 567, and a region of the semiconductor substrate 563 where a charge retention section 554 is formed is a charge retention region 568. Incident light is applied from the back surface (the upper side in the drawing) that is on the opposite side to the front surface of the semiconductor substrate 563.

The interconnection layer 561 is supported by, for example, a substrate support member placed on the lower side of the interconnection layer 561, and a plurality of interconnections 571 that perform the reading of a charge of the photoelectric conversion section 551 formed in the semiconductor substrate 563 etc. are embedded in an interlayer insulating film 572. Further, in the interconnection layer 561, a gate electrode 573 included in the first charge transfer section 130 is placed for the semiconductor substrate 563 via the oxide film 562 in a region between the photoelectric conversion section 551 and the charge retention section 554. By a prescribed voltage being applied to the gate electrode 573, a charge stored in the photoelectric conversion section 551 is transferred to the charge retention section 554. The oxide film 562 has insulating properties, and insulates the front surface side of the semiconductor substrate 563.

An n-type region included in the photoelectric conversion section 551 and an n-type region included in the charge retention section 554 are formed in the semiconductor substrate 563. Further, a pinning layer 574 is formed on each of the back surface side and the front surface side of the photoelectric conversion section 551 and the charge retention section 554. Furthermore, in the semiconductor substrate 563, an inter-pixel separation region 575 for separating adjacent pixels is formed so as to surround the outer periphery of the pixel.

The light blocking layer 564 is formed by a light blocking section 576 containing a material having light blocking properties being embedded in a high-permittivity material film 577. For example, the light blocking section 576 contains a material such as tungsten (W), aluminum (Al), or copper (Cu), and is grounded to a not-illustrated GND. The high-permittivity material film 577 may contain a material such as silicon dioxide ($SiO_2$), hafnium oxide ($HfO_2$), tantalum pentoxide ($Ta_2O_5$), or zirconium dioxide ($ZrO_2$).

Further, the light blocking section 576 includes a cover section placed so as to cover the semiconductor substrate 563 and an embedded section placed so as to be embedded in a vertical trench that is formed in the semiconductor substrate 563 so as to surround the peripheries of the photoelectric conversion section 551 and the charge retention section 554. That is, the cover section of the light blocking section 576 is formed substantially parallel to each layer included in the pixel. On the other hand, the embedded section of the light blocking section 576 is formed up to a prescribed depth so as to extend in a direction substantially orthogonal to the cover section.

Here, the embedded section of the light blocking section 576 may also be formed in the inter-pixel separation region 575 so as to surround the peripheries of the photoelectric conversion section 551 and the charge retention section 554. Further, for example, the embedded section of the light blocking section 576 may form the periphery of the charge retention section 554, or the embedded section of the light blocking section 576 may be formed between the photoelectric conversion section 551 and the charge retention section 554. That is, it is sufficient that the embedded section be formed at least between the photoelectric conversion section 551 and the charge retention section 554, and the photoelectric conversion section 551 and the charge retention section 554 be separated by the embedded section.

Further, an opening for causing light to be incident on the photoelectric conversion section 551 is formed in the light blocking section 576. The opening is formed in a region corresponding to the photoelectric conversion section 551, and other regions where the charge retention section 554, the charge/voltage conversion section 160, etc. are formed are shielded from light by the light blocking section 576.

In the color filter layer 565, a filter that transmits light of a respective corresponding color is placed for each pixel; for example, filters that transmit green light, blue light, and red light are arranged for pixels in what is called the Bayer arrangement. The on-chip lens 566 is a lens for collecting incident light incident on the pixel to the photoelectric conversion section 551.

The pixel of this example includes the light blocking section 576 in which the embedded section is formed at least between the photoelectric conversion section 551 and the charge retention section 554. Thereby, even if light is incident from an oblique direction and has passed through the photoelectric conversion section 551, the light is blocked by the embedded section, and therefore the leakage of light into the charge retention region 568 can be prevented. Thus, the occurrence of optical noise that would occur if light leaked into the charge retention region 568 can be prevented.

Figure 24:
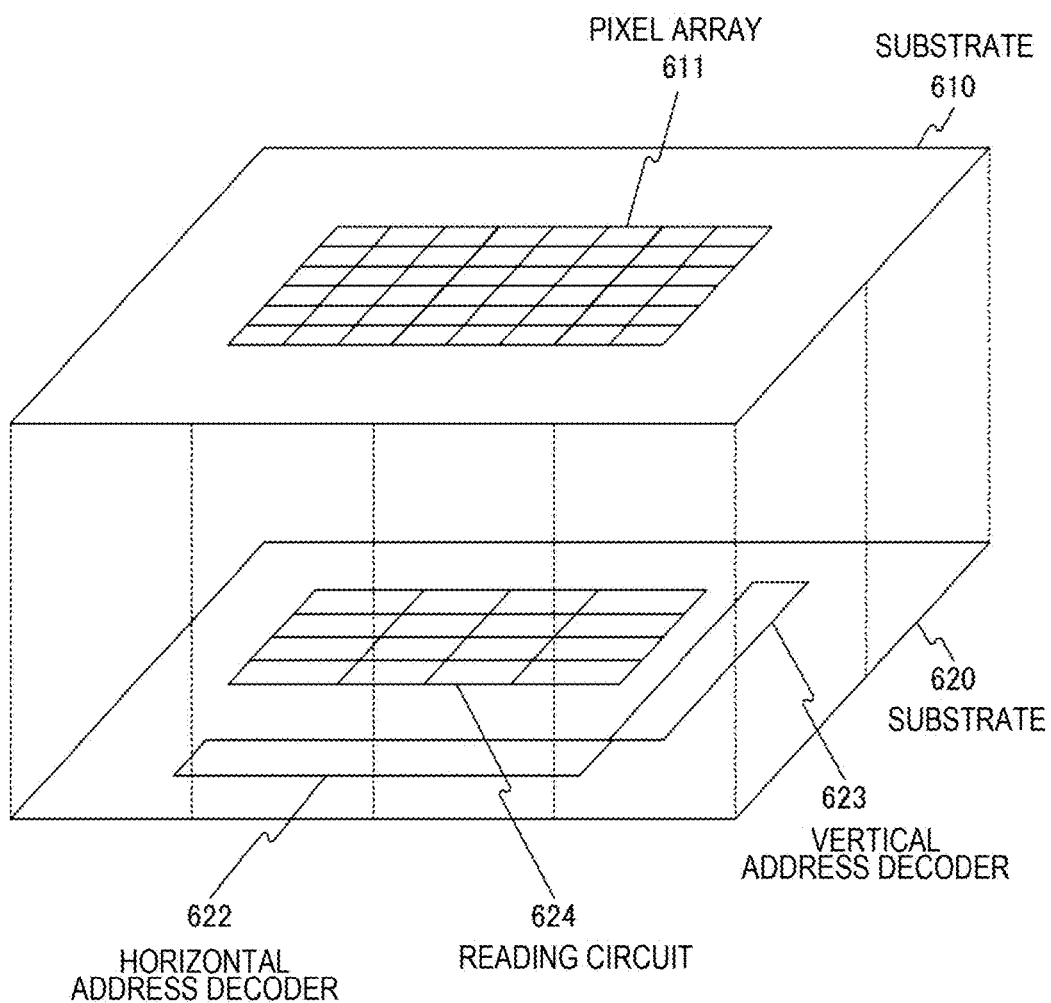
FIG. 24 is a diagram showing an example of an external appearance view in a case where a solid-state imaging device in an embodiment of the present technology is formed on two substrates.

FIG. 24 is a diagram showing an example of an external appearance view in a case where a solid-state imaging device in an embodiment of the present technology is formed on two substrates.

In this example, substrates 610 and 620 are stacked, and the pixel array 611 is placed on the substrate 610. Further, on the substrate 620, a horizontal address decoder 622 and a vertical address decoder 623 are placed around a reading circuit 624. In this example, a solid-state imaging device of the back-side illumination type described above is envisaged, and incident light is applied from above the substrate 610.

A fourth embodiment of the present technology that envisages such a stacked structure is described below. Note that, although herein an example in which two substrates are stacked is described, the fourth embodiment may also be used for a stacked structure of three or more layers.

[Circuit Configuration]

Figure 25:
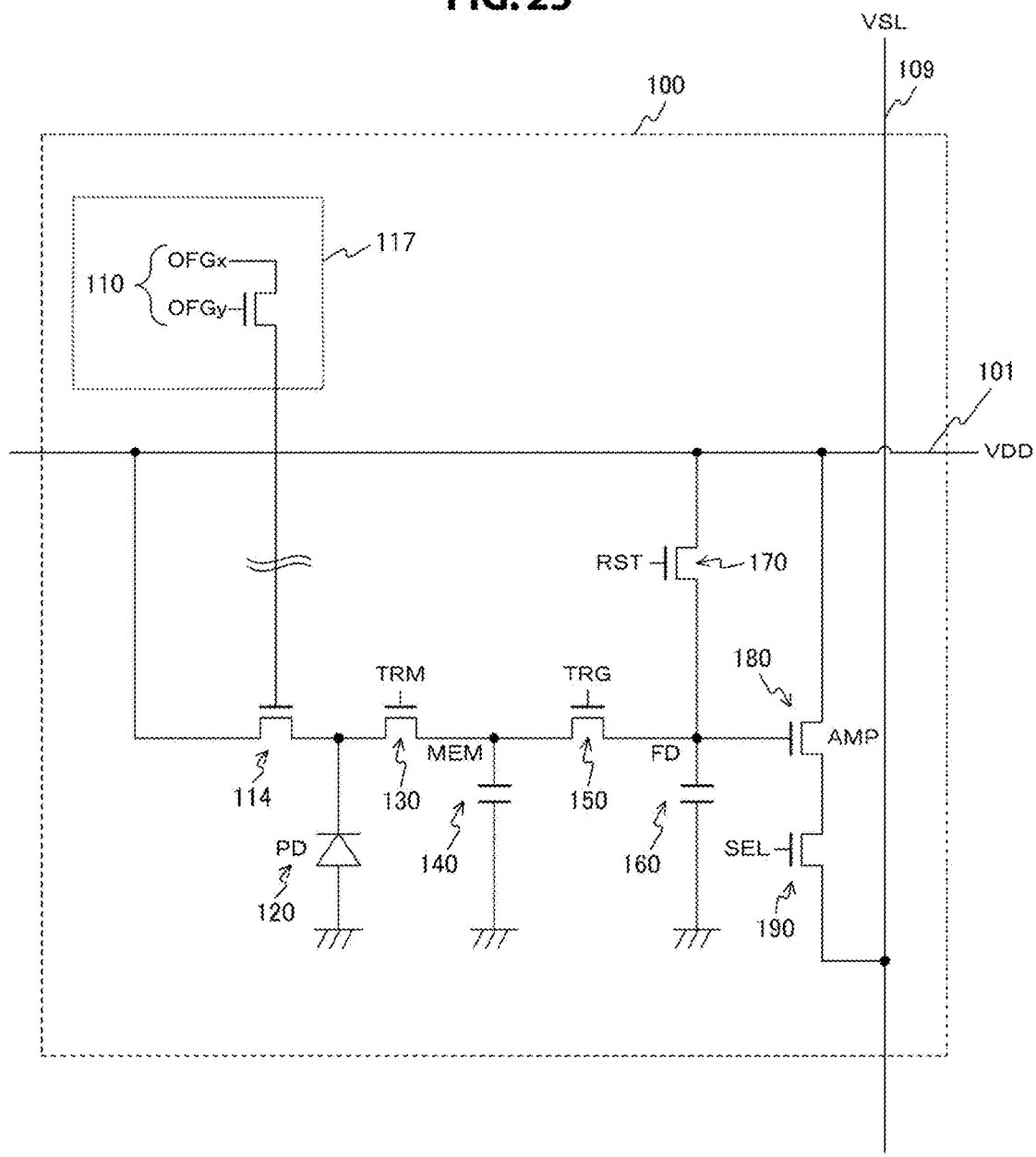
FIG. 25 is a diagram showing an example of a circuit configuration of the pixel 100 in a fourth embodiment of the present technology.

FIG. 25 is a diagram showing an example of a circuit configuration of the pixel 100 in the fourth embodiment of the present technology.

With the second embodiment described above as a basis, the pixel 100 in the fourth embodiment includes a charge release section 117 while supposing that the charge release section 113 of the second embodiment is placed on another substrate. That is, in the charge release section 117, the horizontal address signal OFGx is connected to the drain, and the vertical address signal OFGy is connected to the gate.

[Circuit Layout]

Figure 26:
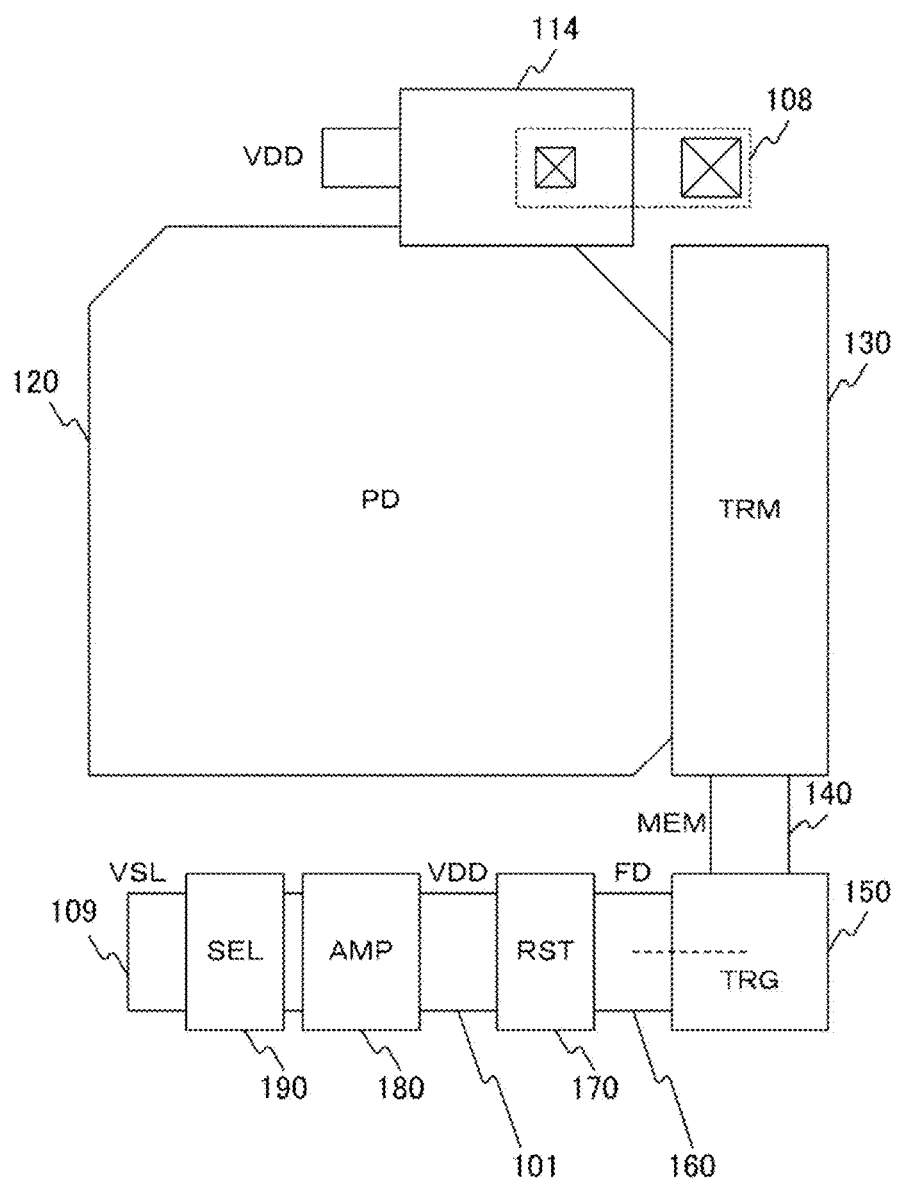
FIG. 26 is a diagram showing an example of a planar view of the pixel 100 in the fourth embodiment of the present technology.

FIG. 26 is a diagram showing an example of a planar view of the pixel 100 in the fourth embodiment of the present technology.

In the pixel 100 in the fourth embodiment, the charge release section 114, the first charge transfer section 130, the second charge transfer section 150, the charge resetting section 170, the signal amplifying section 180, and the pixel selection section 190 are placed around the photoelectric conversion section 120 as the center. The charge release section 117 is placed on another substrate, and connection of pieces of copper (Cu), micro-bonding, etc. may be used for the connection between the substrates, for example. A contact to the other substrate and a contact to the gate of the charge release section 114 are connected together via a metal interconnection 108.

Thus, according to the fourth embodiment of the present technology, the charge release section 117 can be placed on, among stacked substrates, a substrate different from the substrate of the pixel array 10, and the installation area can be reduced.

It should be understood by those skilled in the art that various modifications, combinations, sub-combinations and alterations may occur depending on design requirements and other factors insofar as they are within the scope of the appended claims or the equivalents thereof.

Note that the effects described in this specification are merely illustrative, and are not limitative. Further, the technology according to the present disclosure may achieve other effects.

Additionally, the present technology may also be configured as below.

(1) A solid-state image sensor including:
a selection signal terminal configured to receive a selection signal designated by a pixel address in a two-dimensionally arranged pixel array;
a photoelectric conversion section configured to generate a charge in accordance with incident light and store the charge in accordance with the selection signal; and
a charge retention section configured to retain the charge stored in the photoelectric conversion section at a prescribed timing.

(2) The solid-state image sensor according to (1), further including:
a charge release section configured to release the charge stored in the photoelectric conversion section in accordance with the selection signal.

(3) The solid-state image sensor according to (2),
in which the selection signal includes
a first decoded signal that shows a decoding result of a horizontal address in the pixel array and
a second decoded signal that shows a decoding result of a vertical address in the pixel array, and
the charge release section releases the charge stored in the photoelectric conversion section in a case where both of the first decoded signal and the second decoded signal are effective.

(4) The solid-state image sensor according to (3),
in which the charge release section includes
a first transistor in which a power source is connected to one end and that comes into conduction in a case where the first decoded signal is effective and
a second transistor that is connected in series between the first transistor and the photoelectric conversion section and that comes into conduction in a case where the second decoded signal is effective.

(5) The solid-state image sensor according to (3),
in which the charge release section includes
a first transistor in which one of the first decoded signal and the second decoded signal is connected to a gate and another of the first decoded signal and the second decoded signal is connected to a drain, the first transistor supplying an effective signal from a source in a case where both of the first decoded signal and the second decoded signal are effective, and
a second transistor that is connected in series between a power source and the photoelectric conversion section and that comes into conduction in a case where an effective signal is supplied from the source of the first transistor.

(6) The solid-state image sensor according to (3),
in which the charge release section includes
a transistor that is connected in series between a power source and the photoelectric conversion section, in which one of the first decoded signal and the second decoded signal is connected to a first gate and another of the first decoded signal and the second decoded signal is connected to a second gate, and that comes into conduction in a case where both of the first decoded signal and the second decoded signal are effective.

(7) The solid-state image sensor according to (3), including:
a first chip including
the selection signal terminal,
the photoelectric conversion section, and
the charge retention section; and
a second chip including the charge release section and being stacked on the first chip.

(8) The solid-state image sensor according to any one of (1) to (7), further including:
a charge/voltage conversion section configured to store the charge retained in the charge retention section in order to convert the charge to a voltage; and a first transfer transistor and a second transfer transistor connected in series to each other and configured to transfer the charge retained in the charge retention section to the charge/voltage conversion section, in which the charge retention section is formed integrally with a diffusion layer of the first transfer transistor.

(9) The solid-state image sensor according to any one of (1) to (8), in which the solid-state image sensor includes a plurality of pixels each including the selection signal terminal, the photoelectric conversion section, and the charge retention section, and the solid-state image sensor further includes a charge/voltage conversion section configured to store the charge retained in the charge retention section in each of the plurality of pixels in order to convert the charge to a voltage.

(10) The solid-state image sensor according to (9), further including:

a charge resetting section configured to reset the charge stored in the charge/voltage conversion section.

(11) The solid-state image sensor according to (9) or (10), further including:

a signal amplifying section configured to amplify the charge stored in the charge/voltage conversion section and output a pixel signal at a level in accordance with the charge.

(12) A solid-state imaging device including:

a pixel array in which a plurality of pixels each configured to convert incident light to a pixel signal are two-dimensionally arranged;

an exposure control circuit configured to supply a selection signal that designates one of the plurality of pixels and control exposure in the designated pixel; and a reading circuit configured to read the pixel signal from each of the plurality of pixels, in which each of the plurality of pixels includes a selection signal terminal configured to receive the selection signal, a photoelectric conversion section configured to generate and store a charge in accordance with the incident light, a charge release section configured to release the charge stored in the photoelectric conversion section in accordance with the selection signal, a charge retention section configured to retain the charge stored in the photoelectric conversion section at a prescribed timing, and a charge/voltage conversion section configured to store the charge retained in the charge retention section in order to convert the charge to the pixel signal that is a voltage signal.

(13) The solid-state imaging device according to (12), in which the exposure control circuit includes decoders each configured to decode each of positions in a horizontal direction and a vertical direction of a pixel address in the pixel array, and supplies the selection signal on a basis of a result of the decoding.

(14) The solid-state imaging device according to (12) or (13), in which the exposure control circuit supplies the selection signal for each of specific regions in the pixel array.

(15) The solid-state imaging device according to (14), in which, in a part where the specific regions overlap, the exposure control circuit performs control in agreement with a specific region in which a time of charge accumulation to the photoelectric conversion section is shorter.

What is claimed is:

1. A solid-state image sensor comprising:

a selection signal terminal configured to receive a selection signal designated by a pixel address in a two-dimensionally arranged pixel array, wherein the selection signal includes a horizontal address signal and a vertical address signal;

a photoelectric conversion section configured to generate a charge in accordance with incident light and store the charge in accordance with the selection signal;

a charge retention section configured to retain the charge stored in the photoelectric conversion section at a prescribed timing; and a charge release section configured to release the charge stored in the photoelectric conversion section when the horizontal address signal and the vertical address signal are both effective, wherein the charge release section includes a first transistor and a second transistor connected in series between a power source and the photoelectric conversion section, wherein the first transistor has the horizontal address signal applied thereto and conducts when the horizontal address signal is effective and wherein the second transistor has the vertical address signal applied thereto and conducts when the vertical address signal is effective.

2. The solid-state image sensor according to claim 1, further comprising:

a charge/voltage conversion section configured to store the charge retained in the charge retention section in order to convert the charge to a voltage; and a first transfer transistor and a second transfer transistor connected in series to each other and configured to transfer the charge retained in the charge retention section to the charge/voltage conversion section, wherein the charge retention section is formed integrally with a diffusion layer of the first transfer transistor.

3. The solid-state image sensor according to claim 1, wherein the solid-state image sensor includes a plurality of pixels each including the selection signal terminal, the photoelectric conversion section, and the charge retention section, and the solid-state image sensor further includes a charge/voltage conversion section configured to store the charge retained in the charge retention section in each of the plurality of pixels in order to convert the charge to a voltage.

4. The solid-state image sensor according to claim 3, further comprising:

a charge resetting section configured to reset the charge stored in the charge/voltage conversion section.

5. The solid-state image sensor according to claim 3, further comprising:

a signal amplifying section configured to amplify the charge stored in the charge/voltage conversion section and output a pixel signal at a level in accordance with the charge.

6. A solid-state imaging device comprising:

a pixel array in which a plurality of pixels each configured to convert incident light to a pixel signal are two-dimensionally arranged;

an exposure control circuit configured to supply a selection signal that designates one of the plurality of pixels and control exposure in the designated pixel; and a reading circuit configured to read the pixel signal from each of the plurality of pixels, wherein each of the plurality of pixels includes
- a selection signal terminal configured to receive the selection signal, wherein the selection signal includes a horizontal address signal and a vertical address signal,
- a photoelectric conversion section configured to generate and store a charge in accordance with the incident light,
- a charge release section configured to release the charge stored in the photoelectric conversion section when the horizontal address signal and the vertical address signal are both effective, wherein the charge release section includes a first transistor and a second transistor connected in series between a power source and the photoelectric conversion section, wherein the first transistor has the horizontal address signal applied thereto and conducts when the horizontal address signal is effective and wherein the second transistor has the vertical address signal applied thereto and conducts when the vertical address signal is effective,
- a charge retention section configured to retain the charge stored in the photoelectric conversion section at a prescribed timing, and
- a charge/voltage conversion section configured to store the charge retained in the charge retention section in order to convert the charge to the pixel signal that is a voltage signal.

7. The solid-state imaging device according to claim 6, wherein the exposure control circuit includes decoders each configured to decode each of positions in a horizontal direction and a vertical direction of a pixel address in the pixel array, and supplies the selection signal on a basis of a result of the decoding.

8. The solid-state imaging device according to claim 6, wherein the exposure control circuit supplies the selection signal for each of specific regions in the pixel array.

9. The solid-state imaging device according to claim 8, wherein, in a part where the specific regions overlap, the exposure control circuit performs control in agreement with a specific region in which a time of charge accumulation to the photoelectric conversion section is shorter.

* * * * *